(12) United States Patent
Ahn et al.

(10) Patent No.: US 11,610,937 B2
(45) Date of Patent: Mar. 21, 2023

(54) MICRO LED GROUP SUBSTRATE, METHOD OF MANUFACTURING SAME, MICRO LED DISPLAY PANEL, AND METHOD OF MANUFACTURING SAME

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 199 days.

(21) Appl. No.: 16/921,564

(22) Filed: Jul. 6, 2020

(65) Prior Publication Data

US 2021/0013259 A1    Jan. 14, 2021

(30) Foreign Application Priority Data

Jul. 8, 2019   (KR) ........................ 10-2019-0082287

(51) Int. Cl.
| | | |
|---|---|---|
| *H01L 27/15* | (2006.01) | |
| *H01L 33/48* | (2010.01) | |
| *H01L 33/56* | (2010.01) | |
| *H01L 33/00* | (2010.01) | |

(52) U.S. Cl.
CPC ........ *H01L 27/156* (2013.01); *H01L 33/0095* (2013.01); *H01L 33/486* (2013.01); *H01L 33/56* (2013.01)

(58) Field of Classification Search
CPC ............... H01L 27/156; H01L 33/0095; H01L 33/486; H01L 33/56; H01L 24/37; H01L 24/40; H01L 24/32; H01L 2224/32225; H01L 2224/3701; H01L 24/75; H01L 24/83; H01L 24/95; H01L 25/0753; H01L 33/42; H01L 2224/371; H01L 2224/40095; H01L 2224/40139; H01L 2224/40225; H01L 2224/7598; H01L 2224/83192; H01L 2924/12041; H01L 2924/15156; H01L 2924/181; H01L 33/54; H01L 33/62; H01L 2933/0066; H01L 33/005; H01L 33/36
See application file for complete search history.

(56) References Cited

U.S. PATENT DOCUMENTS

| | | | | |
|---|---|---|---|---|
| 2014/0267683 | A1* | 9/2014 | Bibi | ........................ H01L 24/75 |
| | | | | 348/87 |
| 2014/0367633 | A1* | 12/2014 | Bibi | .................... H01L 27/3246 |
| | | | | 257/13 |
| 2019/0339570 | A1* | 11/2019 | Chen | .................... H01L 51/5281 |
| 2019/0393389 | A1* | 12/2019 | Chen | ........................ H01L 33/58 |

FOREIGN PATENT DOCUMENTS

KR    100731673 B1    6/2007

* cited by examiner

*Primary Examiner* — Jonathan Han

(57) ABSTRACT

Disclosed are a micro LED group substrate provided with a plurality of micro LEDs, a method of manufacturing the same, a micro LED display panel, and a method of manufacturing the same. More particularly, disclosed are a micro LED group substrate provided with a plurality of micro LEDs, a method of manufacturing the same, a micro LED display panel, and a method of manufacturing the same, wherein the need for a micro LED replacement process is eliminated.

18 Claims, 17 Drawing Sheets

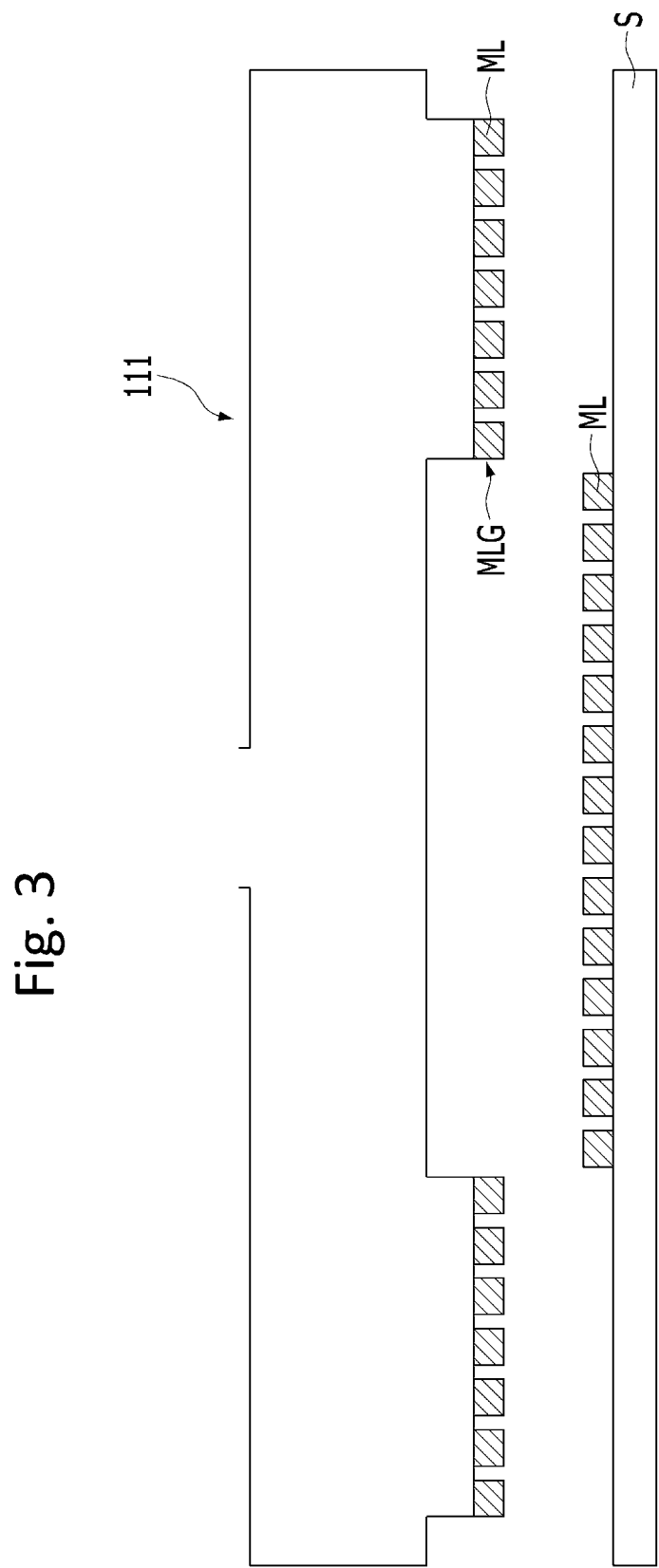

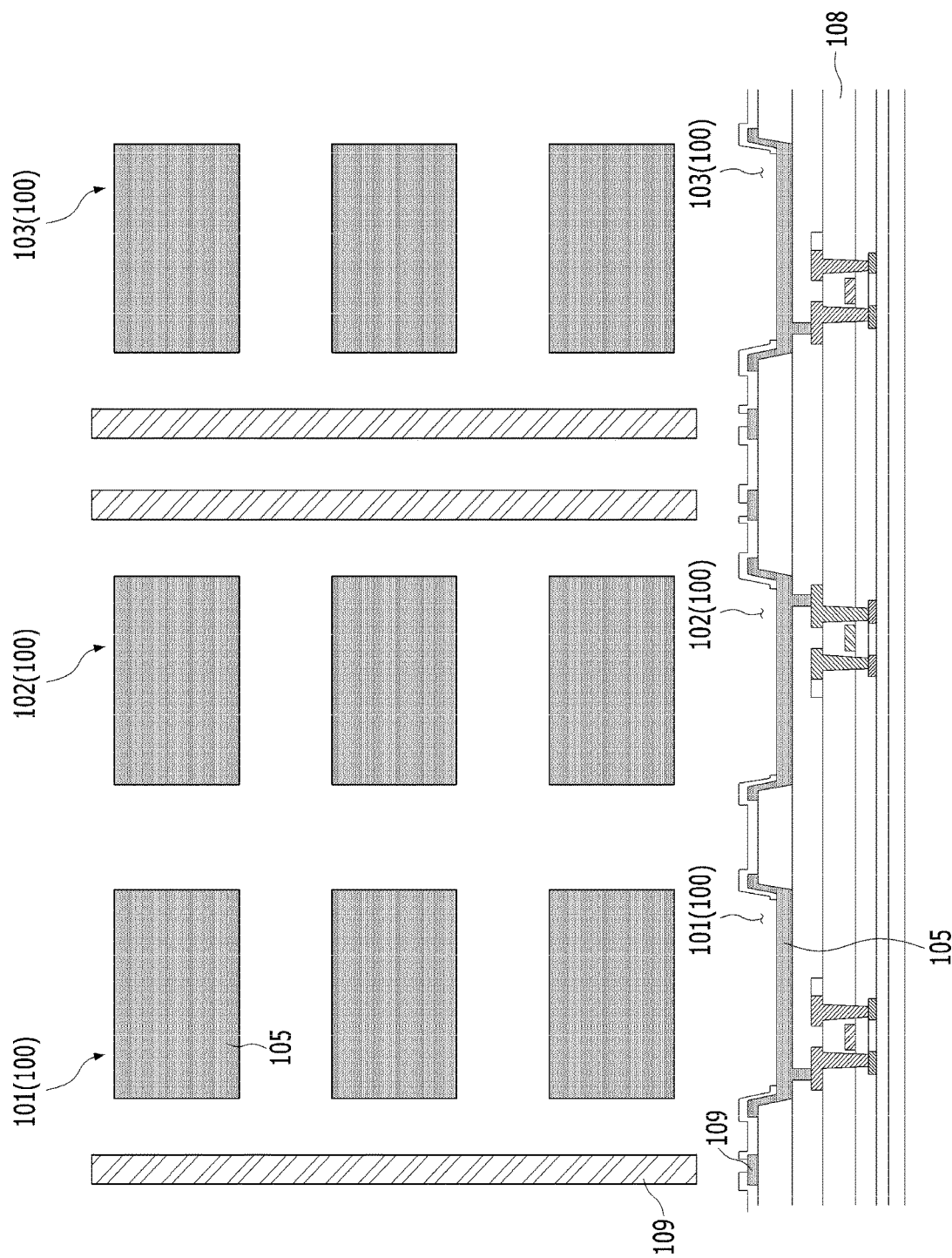

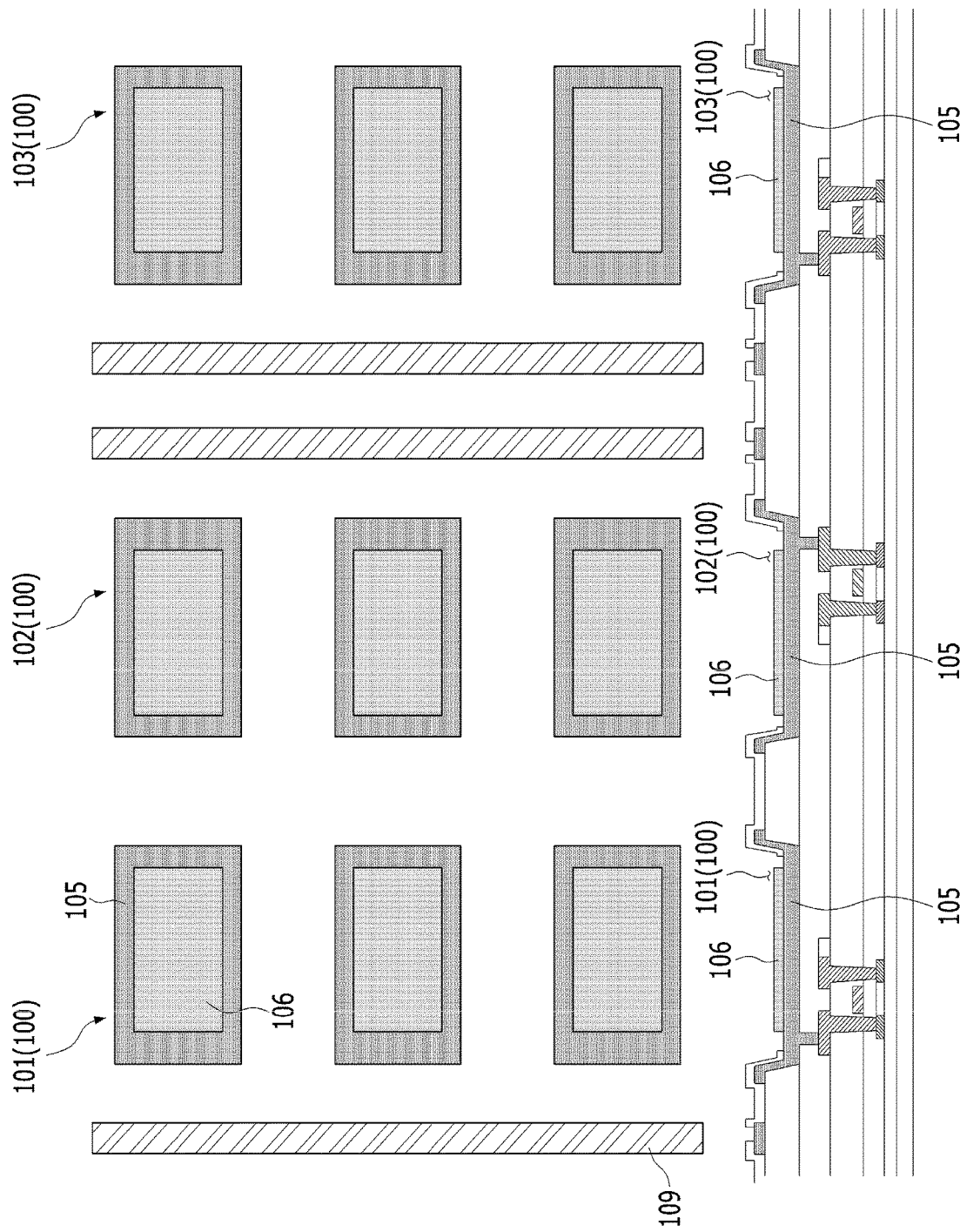

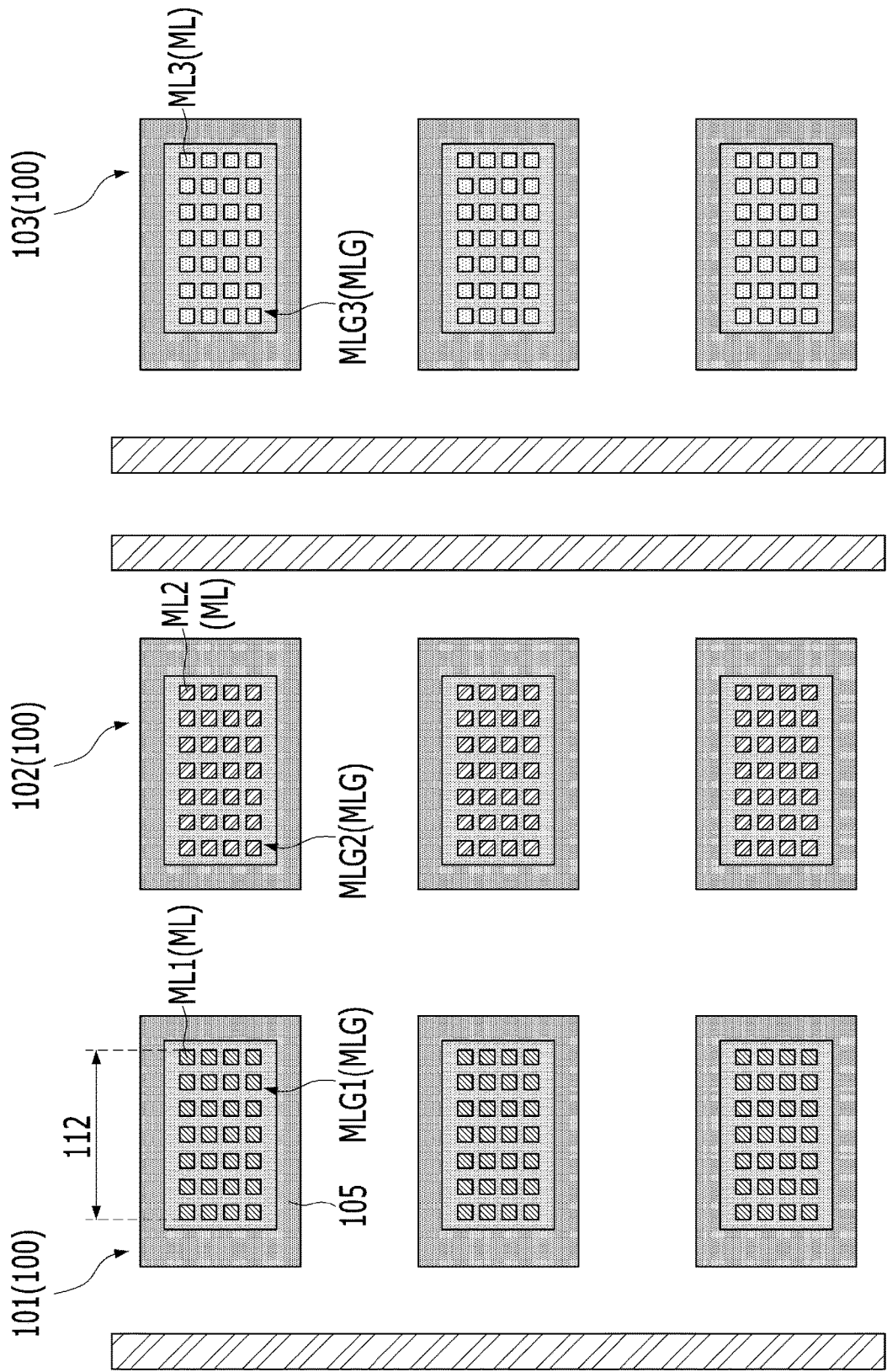

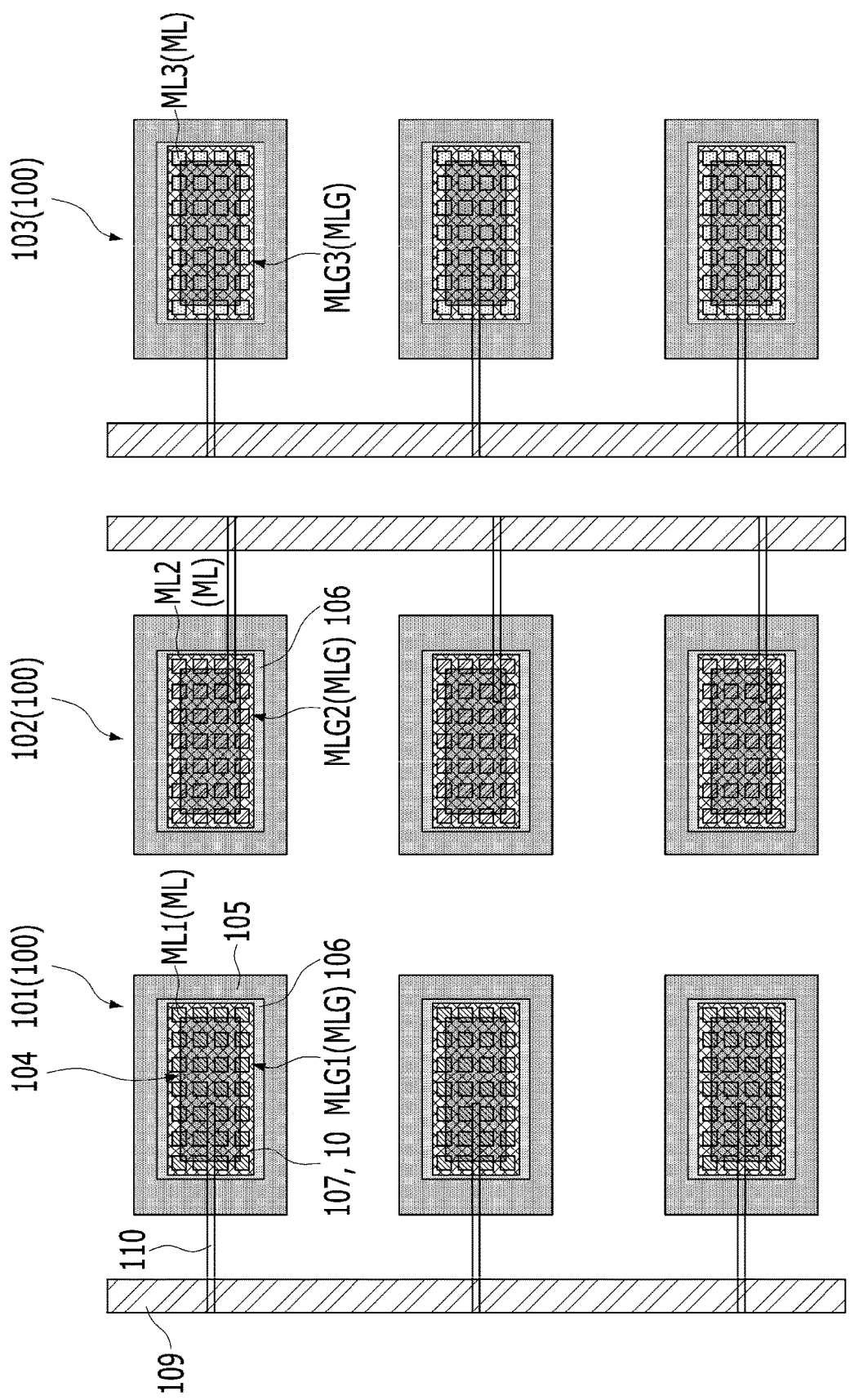

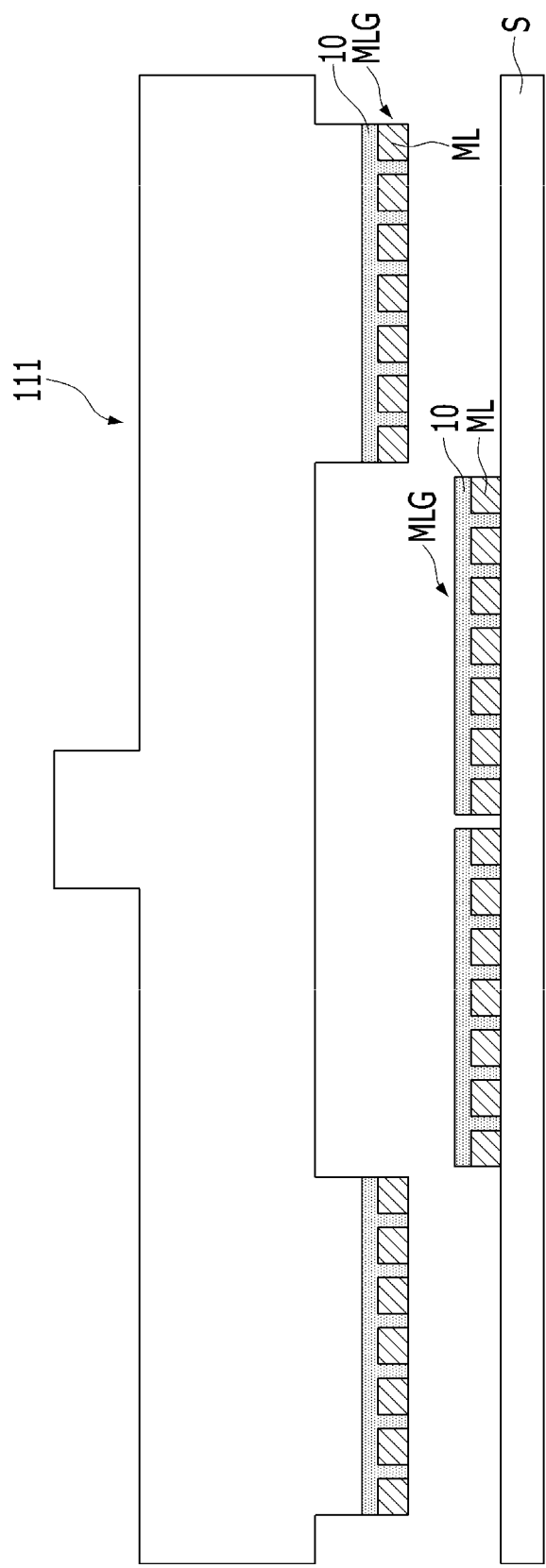

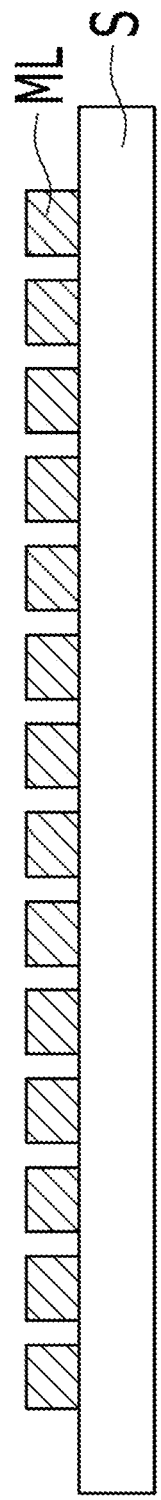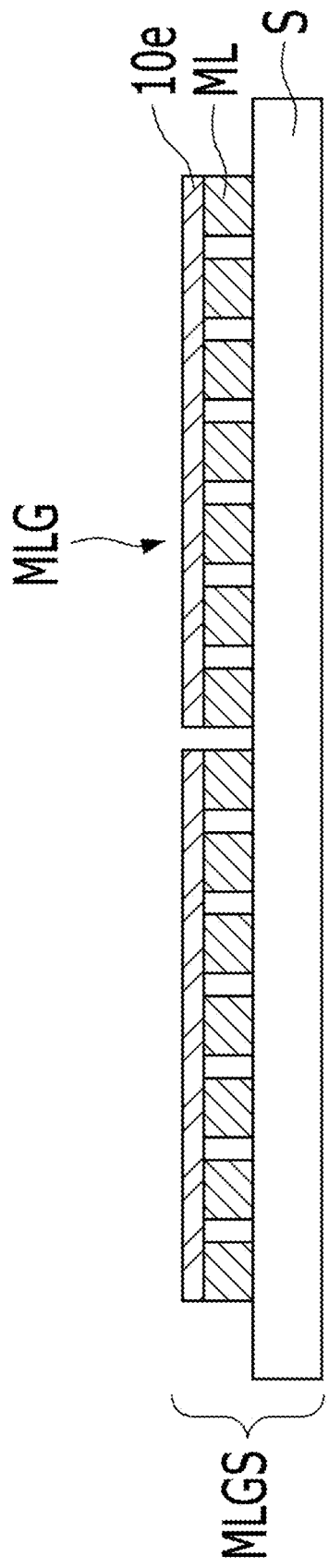

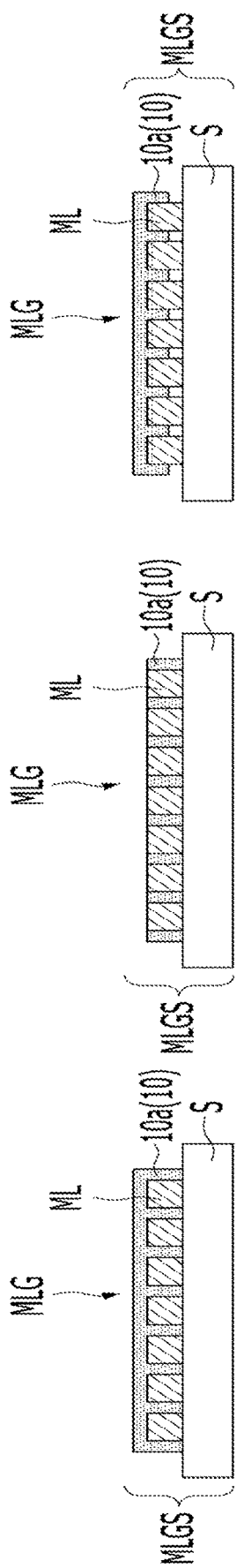

MICRO LED GROUP SUBSTRATE, METHOD OF MANUFACTURING SAME, MICRO LED DISPLAY PANEL, AND METHOD OF MANUFACTURING SAME

CROSS REFERENCE TO RELATED APPLICATION

The present application claims priority to Korean Patent Application No. 10-2019-0082287, filed Jul. 8, 2019, the entire contents of which is incorporated herein for all purposes by this reference.

BACKGROUND OF THE INVENTION

Field of the Invention

The present invention relates to a micro LED group substrate provided with a plurality of micro LEDs, a method of manufacturing the same, a micro LED display panel, and a method of manufacturing the same.

Description of the Related Art

Currently, the display market is still dominated by LCDs, but OLEDs are quickly replacing LCDs and emerging as mainstream products. In the current situation where display makers are rushing to participate in the OLED market, micro light-emitting diode (hereinafter, referred to as 'micro LED') displays have emerged as another next generation display. Liquid crystal and organic materials are the core materials of LCDs and OLEDs, respectively, whereas the micro LED display uses 1 to 100 micrometers (μm) LED chips as a light emitting material.

Since the term "micro LED" emerged in a patent "MICRO-LED ARRAYS WITH ENHANCED LIGHT EXTRACTION" in 1999 (Korean Patent No. 10-0731673) disclosed by Cree Inc., related research papers based thereon were subsequently published. In order to apply micro LEDs to a display, it is necessary to develop a customized microchip based on a flexible material and/or flexible device using a micro LED device, and techniques of transferring micrometer-sized LED chips and accurately mounting the LED chips on a display pixel electrode are required.

FIG. 1 is a view schematically illustrating micro LEDs mounted on a sub-pixel region of a substrate. A micro LED ML' is a very small LED that typically has a size of 1 to 100 micrometers (μm), and thus a high-precision transfer technology is required when the micro LED ML' is mounted on the sub-pixel region 100.

When the micro LED ML' mounted on the sub-pixel region 100 is a defective micro LED, a replacement process of removing the defective micro LED and replacing the same with another new micro LED may be performed. However, due to the micrometer size of the micro LED ML', a high-precision replacement and transfer technique is also required to perform the replacement process. Therefore, when a defective micro LED occurs, there is a problem in that the technology required for the replacement process is demanding and the process is cumbersome.

The replacement process is a process of removing the micro LED ML' mounted on the sub-pixel region 100, and re-transferring a very small micrometer-sized micro LED ML. Therefore, a more precise and demanding transfer technique than a technique of transferring the micro LED ML to the sub-pixel region 100 in which the micro LED ML' is not mounted is required.

Further, the micro LED ML having replaced the defective LED by the replacement process may be defective. In this case, there is the inconvenience of having to re-perform the replacement process, and the high-precision transfer technique is also required again. This may result in reducing the overall efficiency of a process for manufacturing a micro LED display panel.

The foregoing is intended merely to aid in the understanding of the background of the present invention, and is not intended to mean that the present invention falls within the purview of the related art that is already known to those skilled in the art.

DOCUMENTS OF RELATED ART (Patent Document 1) Korean Patent No. 10-0731673.

SUMMARY OF THE INVENTION

Accordingly, the present invention has been made keeping in mind the above problems occurring in the related art, and an objective of the present invention is to provide a micro LED group substrate provided with a plurality of micro LEDs, a method of manufacturing the same, a micro LED display panel, and a method of manufacturing the same, wherein the plurality of micro LEDs of the same type are transferred to a single sub-pixel region collectively at one time, thereby eliminating the need for a micro LED replacement process.

In order to achieve the above objective, according to one aspect of the present invention, there is provided a method of manufacturing a micro LED display panel, the method including: providing a panel substrate in which an array of unit pixel regions, each of which is composed of a plurality of sub-pixel regions, is provided, and a common lower electrode is provided in each of the sub-pixel regions; collectively transferring a micro LED group composed of a plurality of micro LEDs to at least one of the sub-pixel regions; and collectively joining the micro LED group on a common joining layer provided on the common lower electrode.

Further, a common upper electrode may be formed on an upper portion of the micro LED group so that the micro LEDs in the micro LED group are electrically connected in parallel to each other with respect to the common lower electrode and the common upper electrode.

According to another aspect of the present invention, there is provided a method of manufacturing a micro LED display panel, the method including: providing a panel substrate in which an array of unit pixel regions, each of which is composed of first to third sub-pixel regions, is provided, and a common lower electrode is provided in each of the sub-pixel regions; collectively transferring a plurality of first micro LEDs emitting light of a first color to each of a plurality of first sub-pixel regions to form a first micro LED group in the sub-pixel region; collectively transferring a plurality of second micro LEDs emitting light of a second color to each of a plurality of second sub-pixel regions to form a second micro LED group in the sub-pixel region; collectively transferring a plurality of third micro LEDs emitting light of a third color to each of a plurality of third sub-pixel regions to form a third micro LED group in the sub-pixel region; and forming a common upper electrode in each of the first to third sub-pixel regions on which the first to third micro LED groups are mounted.

According to another aspect of the present invention, there is provided a method of manufacturing a micro LED display panel, the method including: forming a micro LED group by connecting individualized micro LEDs of the same type to each other; mounting the micro LED group in a sub-pixel region of a panel substrate provided with a common lower electrode; and forming a common upper electrode in the sub-pixel region on which the micro LED group is mounted.

According to another aspect of the present invention, there is provided a method of manufacturing a micro LED group substrate, the method including: preparing micro LEDs of the same type individualized on a substrate in a matrix shape of rows and columns; and grouping the micro LEDs so that the micro LEDs are connected to each other by a connection part to form a micro LED group while adjacent micro LED groups are not connected to each other by the connection part.

Further, the grouping the micro LEDs may include molding a molding material on the micro LEDs of the substrate to form the connection part, wherein a portion of the molding material may be removed so that the micro LEDs connected to each other by the molding material form the micro LED group, and a region that results from removal of the portion of the molding material becomes a separation section between the adjacent micro LED groups.

Further, the grouping the micro LEDs may be performed by molding the molding material in a partial region so that the micro LEDs connected to each other by the molding material form the micro LED group, and a region in which the molding material is not molded becomes a separation section between the adjacent micro LED groups.

Further, the grouping the micro LEDs may be performed by depositing a metal material on the micro LEDs of the substrate so that the micro LEDs connected to each other by the metal material form the micro LED group, and a region in which the metal material is not deposited becomes a separation section between the adjacent micro LED groups.

Further, the grouping the micro LEDs may be performed by providing an adhesive film on the micro LEDs of the substrate so that the micro LEDs connected to each other by the adhesive film form the micro LED group, and a region in which the adhesive film is not provided becomes a separation section between the adjacent micro LED groups.

According to another aspect of the present invention, there is provided a micro LED group substrate, including: a substrate; micro LEDs of the same type individualized on the substrate in a matrix shape of rows and columns; and the micro LEDs are connected to each other by a connection part to form a micro LED group while adjacent micro LED groups are not connected to each other by the connection part.

Further, the connection part may include a molding material removable by a laser or an etchant.

Further, the connection part may include a photoresist.

Further, the connection part may include an adhesive material.

Further, the connection part may include a metal.

Further, the connection part may include an adhesive film.

Further, the connection part may include epoxy, acrylic (polyacrylate), poly(methyl methacrylate) (PMMA), benzocyclobutene (BCB), polyimide, and polyester.

According to another aspect of the present invention, there is provided a micro LED display panel, including: an array of unit pixel regions each of which is composed of a plurality of sub-pixel regions; a micro LED group mounted on at least one of the sub-pixel regions and composed of a plurality of micro LEDs; a common lower electrode provided on a lower portion of the micro LED group; and a common upper electrode provided on an upper portion of the micro LED group, wherein the micro LEDs in the micro LED group may be electrically connected in parallel to each other with respect to the common lower electrode and the common upper electrode.

Further, the micro LED group may include a defective micro LED.

Further, the micro LED group may include a missing micro LED.

Further, the number of micro LEDs in the micro LED group may be different for each of the sub-pixel regions.

Further, the micro LEDs in the micro LED group may be composed of micro LEDs of the same type.

Further, the common upper electrode may be configured in a surface shape that entirely connects the micro LEDs in the micro LED group to each other.

Further, the common upper electrode may be configured in a strip shape that entirely connects the micro LEDs in the micro LED group to each other.

Further, a pitch interval between the micro LEDs in the micro LED group may be the same as a pitch interval between micro LEDs on a growth substrate for manufacturing the micro LEDs.

The micro LED display panel may further include a single common joining layer provided on the common lower electrode, wherein the micro LED group may be joined on the common joining layer.

Further, a first micro LED group emitting a first color may be mounted on a first sub-pixel region of the sub-pixel regions, a second micro LED group emitting light of a second color may be mounted on a second sub-pixel region of the sub-pixel regions, and a third micro LED group emitting light of a third color may be mounted on a third sub-pixel region of the sub-pixel regions.

Further, micro LEDs of the same type may be mounted on each of the plurality of sub-pixel regions, and a color conversion part may be provided on the common upper electrode.

As described above, according to the present invention, when manufacturing the micro LED display panel, it is possible to transfer the plurality of micro LEDs to the sub-pixel region collectively at one time. Accordingly, it is possible to obtain an effect of improving the efficiency of a manufacturing process of the micro LED display panel, and improving the unit per hour (UPH) of finished product production.

Further, according to the present invention, it is possible to omit the replacement process due to a defective micro LED or a missing micro LED. As a result, it is possible to improve rapidity of the manufacturing process.

BRIEF DESCRIPTION OF THE DRAWINGS

The above and other objectives, features, and other advantages of the present invention will be more clearly understood from the following detailed description when taken in conjunction with the accompanying drawings, in which:

FIG. 3 is a view schematically illustrating a transfer head for transferring a micro LED to be mounted on a sub-pixel region;

FIGS. 4 to 7 are views schematically illustrating a method of manufacturing a micro LED display panel according to the present invention;

FIG. 8 is a view schematically illustrating a state in which a micro LED group is adsorbed on the transfer head; and FIGS. 9A to 17D are views illustrating various embodiments of micro LED groups.

DETAILED DESCRIPTION OF THE INVENTION

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited the specifically-listed embodiments and the conditions.

The above described objectives, features, and advantages will be more apparent through the following detailed description related to the accompanying drawings, and thus those of ordinary skill in the art may easily implement the technical spirit of the invention.

The embodiments of the present invention will be described with reference to cross-sectional views and/or perspective views which schematically illustrate ideal embodiments of the present invention. Thus, the embodiments should not be construed as limited to the particular shapes of regions illustrated herein but are to include deviations in shapes that result, for example, from manufacturing.

Hereinafter, prior to describing exemplary embodiments of the present invention with reference to the accompanying drawings, a micro device may include a micro LED. The micro LED is not a package type covered with molded resin or the like but a piece obtained by cutting out a wafer used for crystal growth, and academically refers to one having a size of 1 to 100 μm. However, the micro LED described herein is not limited to one having a size (length of one side) of 1 to 100 μm, and includes one having a size of equal to or greater than 100 μm or a size of less than 1 μm.

Further, the configurations of the exemplary embodiments of the present invention described below can also be applied to transfer of micro-devices that can be applied without changing the technical spirit of each embodiment.

Hereinafter, embodiments of the present invention will be described with reference to the accompanying drawings.

1. Regarding a Micro LED Display Panel According to the Present Invention

Figure 1:
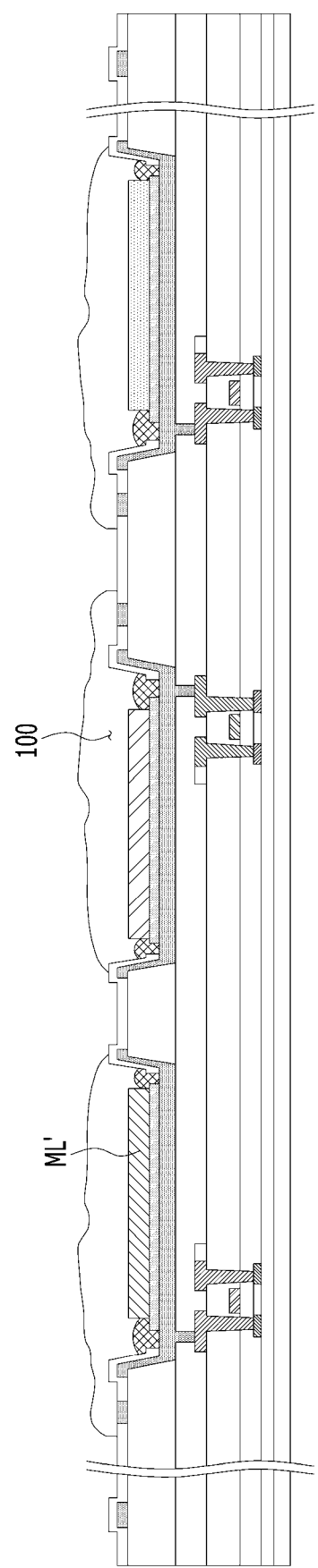
FIG. 1 is a view illustrating a technology underlying the present invention.
Figure 2:
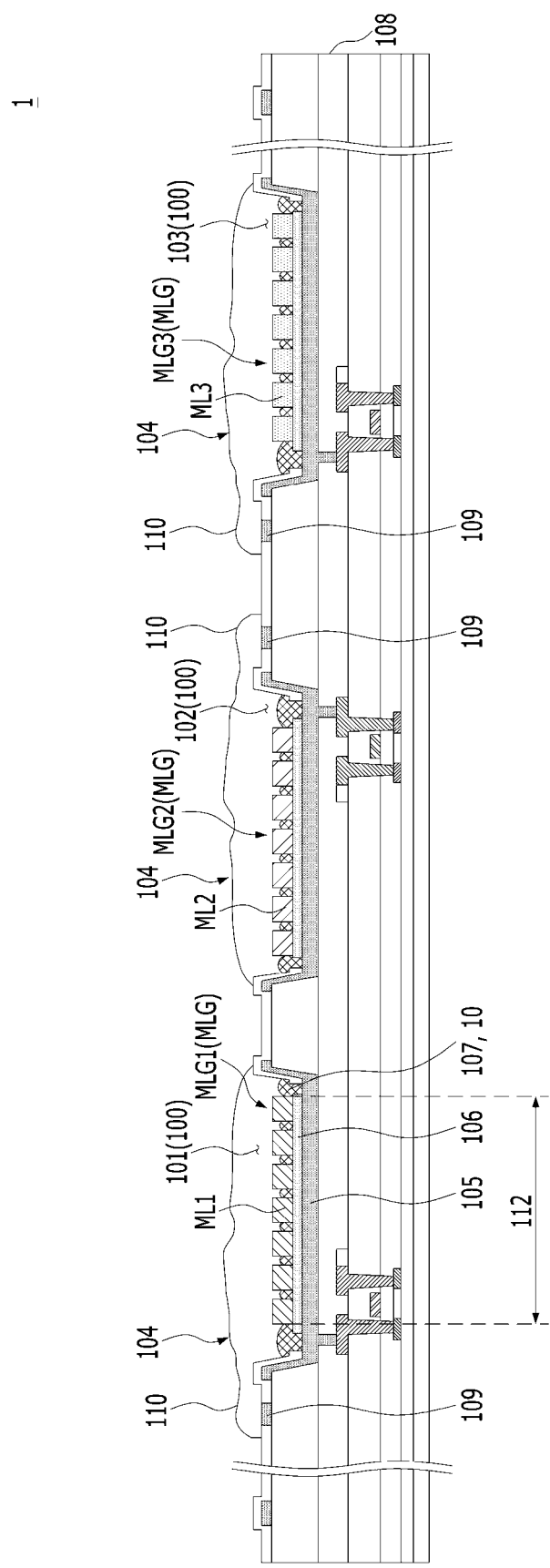
FIG. 2 is an enlarged view illustrating a unit pixel region of a micro LED display panel according to the present invention.

FIG. 2 is an enlarged view illustrating a unit pixel region of a micro LED display panel according to the present invention.

As illustrated in FIG. 2, the micro LED display panel according to the present invention may include an array of unit pixel regions each of which is composed of a plurality of sub-pixel regions 100 emitting light of different colors, a micro LED group MLG mounted on at least one of the sub-pixel regions 100 and having a size in which a plurality of micro LEDs MLs are mounted instead of mounting one micro LED, a common lower electrode 105 provided on a lower portion of the micro LED group MLG, and a common upper electrode 104 provided on an upper portion of the micro LED group MLG. By such a configuration, in the micro LED display panel according to the present invention, the micro LEDs MLs in the micro LED group MLG may be electrically connected in parallel to each other with respect to the common lower electrode 105 and the common upper electrode 104.

As illustrated in FIG. 2, the micro LED display panel 1 may include a panel substrate 108 having the plurality of sub-pixel regions 100.

The panel substrate 108 may be a panel substrate provided with a wiring capable of driving the micro LED group MLG mounted on the sub-pixel region 100. In other words, the panel substrate 108 may be a substrate having a wiring capable of driving the respective micro LED groups MLGs mounted on the unit pixel regions composed of the plurality of sub-pixel regions 100. The panel substrate 108 may be manufactured to be able to individually or collectively drive the micro LED groups MLGs so that the micro LED groups MLGs mounted on the sub-pixel regions 100 may be individually or collectively driven.

The display panel is configured as a collection of unit pixels, and each of the unit pixels is configured as a collection of sub-pixel regions. Here, the sub-pixel regions cannot be designed arbitrarily large because the unit pixels are arranged while maintaining a predetermined pitch interval according to regulations. Due to these limitations, conventionally, one micro LED ML is transferred to a single sub-pixel region. However, in transferring one micro LED ML to the single sub-pixel region, when the micro LED ML is defective or missing, a replacement process that newly transfers a normal micro LED ML is essential.

On the other hand, the present invention is characterized in that the plurality of micro LEDs of the same type are transferred to a single sub-pixel region collectively at one time, thereby eliminating the need for the replacement process of the micro LEDs. In the present invention, the single sub-pixel region is configured to have substantially the same area as the conventional sub-pixel region, and thus, according to the present invention, there is provided a configuration in which the plurality of micro LEDs of the same type are transferred and mounted on the conventional sub-pixel region. This makes it possible to achieve an effect that the need for the replacement process is eliminated while maintaining the area of the sub-pixel region as that of the conventional sub-pixel region. Additionally, in contrast to a configuration in which one micro LED ML is transferred to the conventional single sub-pixel region, according to the present invention, since the plurality of micro LEDs of the same type are transferred to the single sub-pixel region having the same size as the conventional sub-pixel region, there may be an effect of improving luminous efficacy in the sub-pixel region.

Further, in the configuration in which one micro LED ML is transferred to the single sub-pixel region, when the micro LED ML mounted on the sub-pixel region reaches its lifespan during use, the sub-pixel region will also reach its lifespan. On the other hand, according to the configuration of the present invention in which the plurality of micro LEDs of the same type are mounted on the single sub-pixel region, the sub-pixel region will reach its lifespan only when all the plurality of micro LEDs mounted on the sub-pixel region reach their lifespan. Therefore, there may be an effect of extending the lifespan of the display panel compared to the conventional configuration.

Conventionally, as an example, one micro LED having a width of 30 μm may be mounted on the sub-pixel region 100. A micro LED mounting region formed when one micro LED is mounted on the sub-pixel region 100 may be formed to have same size as a width of 30 μm of one micro LED.

Conventionally, when one micro LED mounted on the sub-pixel region 100 is defective, the replacement process of removing the defective one and replacing the same with a normal micro LED is performed. The disadvantage of the replacement process is that a very small-sized micro LED is removed and replaced with another new micro LED, which may be a demanding process. Another disadvantage is that when the new micro LED is defective, the replacement process has to be re-performed, which is cumbersome.

However, the present invention is characterized in that instead of mounting one micro LED having a width of 30 μm in the sub-pixel region 100, the plurality of micro LEDs MLs are mounted on a micro LED group mounting region 112 having a width corresponding to the width of 30 μm.

As an example, the plurality of micro LEDs MLs constituting the micro LED group MLG may be provided as micro LEDs each of which has a width of 2 μm. In this case, in consideration of a pitch interval between the plurality of micro LEDs MLs constituting the micro LED group MLG, a micro LED group MLG having a matrix shape of 7 rows and 7 columns may be formed. Here, the pitch interval between the micro LEDs MLs in the micro LED group MLG may be the same as that between micro LEDs MLs on a growth substrate for manufacturing the micro LEDs MLs.

The micro LED group MLG composed of a plurality of rows and columns as described above may have a mounting area corresponding to the area of a conventional one micro LED mounting region having a width of 30 μm and may be mounted on the sub-pixel region 100.

The micro LED group MLG may be formed by adsorbing individualized micro LEDs MLs on a substrate S (e.g., a growth substrate or a temporary substrate) as a group using a transfer head, and then transferring the group of micro LEDs MLs onto the sub-pixel region 100.

Alternatively, the micro LED group MLG may be formed by pre-combining the individualized micro LEDs MLs on the substrate S as a group before transferring the plurality of micro LEDs MLs to the sub-pixel region 100.

In this case, the individualized micro LEDs MLs on the substrate S may be connected to each other by a connection part 10 to form one micro LED group MLG.

The connection part 10 may include a molding material 10a removable by a laser or an etchant, a photoresist 10b, an adhesive material 10a', a metal, and an adhesive film 10e.

In this case, the molding material 10a and the photoresist 10b may be formed in a shape charged between the micro LEDs MLs in the micro LED group MLG. The connection part 10 of this type may include epoxy, acrylic (polyacrylate), poly(methyl methacrylate) (PMMA), benzocyclobutene (BCB), polyimide, and polyester. When the connection part 10 is configured as described above, the connection part 10 may function as a passivation layer 107. Therefore, when the micro LED group MLG in which the plurality of micro LEDs MLs are connected to each other by the connection part 10 having the above-described configuration is mounted on the sub-pixel region 100, a separate process of removing the connection part 10 may not be performed.

The micro LED group MLG mounted on the sub-pixel region 100 may be joined on a single common joining layer 106 provided on the common lower electrode 105. In detail, in the micro LED display panel 1 according to the present invention, the common lower electrode 105 may be provided on the sub-pixel region 100, and the single common bonding layer 106 may be provided on the common lower electrode 105.

The micro LED group MLG may be joined on the common bonding layer 106 to be mounted in a shape fixed to the sub-pixel region 100.

The passivation layer 107 may be provided between the micro LEDs MLs in the micro LED group MLG and between the micro LED group MLG and the sub-pixel region 100.

The passivation layer 107 may be provided between the common upper electrode 104 provided on the upper portion of the micro LED group MLG, which will be described later, and the sub-pixel region 100. The passivation layer 107 may be provided at a lower height than the micro LEDs MLs constituting the micro LED group MLG. Accordingly, when only the passivation layer 107 is provided before the common upper electrode 104 is provided on the upper portion the micro LED group MLG, an upper portion of the micro LED group MLG may be exposed. The exposed upper portion of the micro LED group MLG may be covered by the common upper electrode 104, which will be described later.

The passivation layer 107 may function as the connection part 10 that connects the plurality of micro LEDs MLs mounted on the sub-pixel region 100 to each other to form the micro LED group MLG.

The passivation layer 107 may be made of an organic insulating material. For example, the passivation layer 107 may be made of acrylic, poly(methyl methacrylate) (PMMA), benzocyclobutene (BCB), polyimide, acrylate, epoxy, and polyester, but is not limited thereto.

The common upper electrode 104 may be provided on the upper portion of the micro LED group MLG mounted on the sub-pixel region 100 with such a structure. The common upper electrode 104 may be configured to include an auxiliary electrode 110 connected to a vertical common electrode 109 on the panel substrate 108 to form electrical connection with the vertical common electrode 109.

The common upper electrode 104 may be formed in a shape that covers the micro LED group MLG. However, the form in which the common upper electrode 104 is formed is not limited to this. For example, the common upper electrode 104 may be formed in a shape that entirely connects the micro LEDs MLs in the micro LED group MLG to each other.

In detail, the common upper electrode 104 may be configured in a surface shape that entirely connects the micro LEDs MLs in the micro LED group MLG to each other. In this case, the common upper electrode 104 configured in the surface shape may have a shape that entirely covers the micro LEDs MLs in the micro LED group MLG. Alternatively, the common upper electrode 104 may have a shape that covers at least a portion of an upper surface of each of the micro LEDs MLs in the micro LED group MLG, while entirely connecting the micro LEDs MLs in the micro LED group MLG to each other.

Alternatively, the common upper electrode 104 may be configured in a strip shape that entirely connects the micro LEDs MLs in the micro LED group MLG to each other. The strip-shaped common upper electrode 104 may be composed of a horizontal electrode and a vertical electrode to entirely connect the micro LEDs MLs to each other.

The micro LEDs MLs in the micro LED group MLG may be electrically connected in parallel to each other with respect to the common lower electrode 105 and the common upper electrode 104 respectively provided the lower and upper portions of the micro LED group MLG. This may ensure that even when the micro LED group MLG includes a defective micro LED, the micro LED group MLG emits light. Therefore, there is no need to perform the replacement process of removing a defective micro LED present in the sub-pixel region 100 and replacing the same with a normal micro LED.

In other words, in the present invention, since the plurality of micro LEDs MLs in the micro LED group MLG are electrically connected in parallel to each other, the replacement process of removing the defective micro LED that is present in the micro LED group MLG and mounted on the sub-pixel region 100 may be omitted.

The replacement process of removing the defective micro LED and replacing the same with another new micro is a process of removing one defective micro LED of a very small size and replacing the same with another new micro LED. This requires a high-precision replacement and transfer technology, which makes the process of performing the replacement process very demanding.

However, in the present invention, even when the defective micro LED is present in the micro LED group MLG, there is no negative effect on light emission due to other micro LEDs constituting the micro LED group MLG, and thus the replacement process may be omitted in a finished product manufacturing process. As a result, it is possible to rapidly perform the finished product manufacturing process, and to obtain an effect of improving the unit per hour (UPH) of finished product production.

The micro LED group MLG mounted on the sub-pixel region 100 may include the defective micro LED as described above, or alternatively, may include a micro LED missing during a transfer process.

In detail, the micro LEDs MLs constituting the micro LED group MLG mounted on the sub-pixel region 100 may have a very small size. Therefore, the missing micro LED may be present in the micro LED group MLG that is mounted on the sub-pixel region 100 during the transfer process. As an example, no micro LED may be present in a certain row and a certain column in the micro LED group MLG having a matrix shape of 7 rows and 7 columns. This may be a result that occurs due to the missing micro LED when adsorbing the micro LED group MLG to transfer the micro LED group MLG to the sub-pixel region 100. As a result, the micro LED group MLG of the sub-pixel region 100 may include a blank space present in a certain row and a certain column, with a missing micro LED.

As illustrated in FIG. 2, the micro LED display panel 1 may be configured such that the micro LED group MLG is mounted on each of the plurality of sub-pixel regions 100. In this case, the number of micro LEDs MLs in the micro LED group MLG may be different for each of the sub-pixel regions 100. The respective micro LED groups MLGs mounted on the sub-pixel regions 100 may emit light of different colors, and a difference in light emission characteristics may be present between the respective micro LEDs MLs provided in the sub-pixel regions 100. For example, a micro LED group MLG composed of red micro LEDs emitting light of a red color may be mounted on a first sub-pixel region, a micro LED group MLG composed of green micro LEDs emitting light of a green color may be mounted on a second sub-pixel region, and a micro LED group MLG composed of blue micro LEDs emitting light of a blue color may be mounted on a third sub-pixel region. Here, due to the difference in light emission characteristics of the respective micro LEDs MLs, an area (horizontal length×vertical length) of the micro LEDs MLs in at least one of the sub-pixel regions may be greater or less than an area (horizontal length×vertical length) of the micro LEDs MLs in each of the remaining sub-pixel regions. As described above, since there may be a difference in the area of the micro LEDs MLs mounted on the respective sub-pixel regions and the sub-pixel regions 100 have substantially the same area, there may be a difference in number of micro LEDs MLs in the micro LED groups MLGs in the sub-pixel regions 100.

On the other hand, the difference in the number of micro LEDs MLs may occur due to missing micro LEDs or may occur when the micro LED groups MLGs are formed.

However, since the micro LEDs MLs in the micro LED group MLG mounted on each of the sub-pixel regions 100 are electrically connected in parallel to each other with respect to the common lower electrode 105 and the common upper electrode 104, the micro LEDs MLs may emit light of color regardless of the difference in the number.

Alternatively, the micro LED display panel 1 may be configured such that the micro LED group MLG is mounted on one of the sub-pixel regions 100 and one micro LED is mounted on each of the remaining sub-pixel regions 100. In this case, even when the micro LED group MLG of one of the sub-pixel regions 100 includes a defective micro LED or a missing micro LED, the micro LED group MLG may emit light of color in conjunction with one micro LED mounted on each of the remaining sub-pixel regions 100. Hereinafter, it will be described that the micro LED group MLG is mounted on each of the plurality of sub-pixel regions 100.

The plurality of sub-pixel regions 100 may emit light of different colors by the respective micro LED groups MLGs mounted on the sub-pixel regions 100. The plurality of sub-pixel regions 100 emitting light of different colors may constitute one unit pixel region. One unit pixel region may be composed of first to third sub-pixel regions 101, 102, and 103. In this case, first to third micro LED groups MLG1 to MLG3 emitting light of first to third colors may be mounted on the first to third sub-pixel regions 101, 102, and 103, respectively. The panel substrate 108 may be provided with an array of a plurality of unit pixel regions having such a configuration.

Referring to FIG. 2, among the sub-pixel regions illustrated in FIG. 2, a sub-pixel region 100 located first from the left may be the first sub-pixel region 101. The second sub-pixel region 102 and the third sub-pixel region 103 may be sequentially provided on the right of the first sub-pixel region 101. In this case, among the sub-pixel regions 100, the first micro LED group MLG1 emitting light of the first color may be mounted on the first sub-pixel region 101, the second micro LED group MLG2 emitting light of the second color may be mounted on the second sub-pixel region 102, and the third micro LED group MLG3 emitting light of the third color may be mounted on the third sub-pixel region 103.

In this case, micro LEDs ML1, ML2, and ML3 in the micro LED groups MLG1, MLG2, and MLG3 mounted on the respective sub-pixel regions 101, 102, and 103 may be micro LEDs of different types.

Alternatively, micro LEDs MLs of the same type may be mounted on the plurality of sub-pixel regions 100. The micro LEDs MLs of the same type may be mounted on each of the plurality of sub-pixel regions 100, and a color conversion part may be provided on the common upper electrode 104. As an example, when the micro LEDs MLs of the same type are mounted on the plurality of sub-pixel regions 100, the micro LEDs MLs of the same type may be micro LEDs emitting light of a blue color. The common upper electrode 104 may be provided on an upper portion of each of the micro LED groups MLGs composed of a plurality of blue micro LEDs, and the color conversion part may be provided on the common upper electrode 104. The respective color conversion parts may convert wavelengths emitted from the micro LED groups MLGs to wavelengths capable of emitting light of different colors. Therefore, when the micro LEDs MLs of the same type are mounted on the plurality of sub-pixel regions 100, the color conversion parts may allow the plurality of sub-pixel regions 100 to emit light of different colors.

2. Regarding a Method of Manufacturing a Micro LED Display Panel According to the Present Invention The method of manufacturing the micro LED display panel according to the present invention may include: providing a panel substrate 108 in which an array of unit pixel regions, each of which is composed of first to third sub-pixel regions 101, 102, and 103, is provided, and a common lower electrode 105 is provided in each of the sub-pixel regions 100; collectively transferring a micro LED group MLG composed of a plurality of micro LEDs MLs to at least one of the sub-pixel regions 100; and collectively joining the micro LED group MLG on a common joining layer 106 provided on the common lower electrode 105. After the step of collectively joining the micro LED group MLG on the common joining layer 106, a step of forming a common upper electrode 104 on the micro LED group MLG may be performed. In the micro LED display panel 1 manufactured through the above process, the micro LEDs MLs in the micro LED group MLG may be electrically connected in parallel to each other with respect to the common lower electrode 105 and the common upper electrode 104.

To perform the step of collectively transferring the micro LED group MLG composed of the plurality of micro LEDs MLs to at least one of the sub-pixel regions 100 of the panel substrate 108 provided in the step of providing the panel substrate 108, a means for transferring the plurality of micro LEDs MLs to the sub-pixel region 100 may be used.

In detail, as the means for transferring the plurality of micro LEDs MLs provided on a substrate S (e.g., a growth substrate or a temporary substrate) to the sub-pixel region 100, a transfer head for performing a function of adsorbing the micro LEDs MLs on the substrate S by means of adsorption force and transferring the adsorbed micro LEDs MLs to the sub-pixel region 100 may be used. Here, examples of the adsorption force include vacuum suction force, electrostatic force, magnetic force, and van der Waals force. Therefore, the transfer head used for manufacturing the micro LED display panel 1 according to the present invention may adsorb the plurality of micro LEDs MLs by means of the adsorption force, e.g., vacuum suction force, electrostatic force, magnetic force, or van der Waals force.

The transfer head is not limited in terms of the structure thereof, as long as the structure is capable of generating the above-described vacuum suction force, electrostatic force, magnetic force, or van der Waals force. In this case, the transfer head may be formed in a suitable structure depending on the adsorption force used thereby efficiently adsorbing the micro LEDs MLs.

When performing the step of collectively transferring the micro LED group MLG composed of the plurality of micro LEDs MLs to the sub-pixel region 100 using the transfer head, (i) a method of transferring individualized micro LEDs as a group by the transfer head, or (ii) a method of transferring combined micro LEDs as a group by the transfer head may be used.

(i) The Method of Transferring Individualized Micro LEDs as a Group by the Transfer Head FIG. 3 is a view illustrating a state in which the transfer head for performing a function of transferring micro LEDs to be mounted on sub-pixel regions adsorbs the individualized micro LEDs as a group.

The step of collectively transferring the micro LED group MLG to the sub-pixel region 100 may be performed, as illustrated in FIG. 3, by adsorbing, by the transfer head 111, the micro LED group MLG to the sub-pixel region 100, the micro LED group MLG being formed by adsorbing the plurality of micro LEDs MLs as a group among the individualized micro LEDs MLs manufactured on the substrate S.

As illustrated in FIG. 3, the transfer head 111 may adsorb the plurality of micro LEDs MLs as a group among the individualized micro LEDs MLs manufactured on the substrate S. In other words, the transfer head 111 may have a lower surface region corresponding to a micro LED presence region formed by provision of the individualized micro LEDs MLs on the substrate S, and may generate adsorption force in a region of the lower surface region, the region corresponding to an adsorption target region on the substrate S. Accordingly, the plurality of micro LEDs MLs provided in the adsorption target region, which is at least a partial region on the substrate S, may be adsorbed as a group to the transfer head 111. As a result, the micro LED group MLG composed of the plurality of micro LEDs MLs may be formed with respect to an adsorption region of the lower surface region of the transfer head 111, the adsorption region to which the micro LEDs MLs are adsorbed.

In the transfer head 111 illustrated in FIG. 3, although the adsorption region to which the plurality of micro LEDs MLs are adsorbed in the lower surface region of the transfer head 111 is illustrated as being formed in a protruding structure, this is one example illustrated for ease of explanation, and the structure of the transfer head 111 is not limited thereto.

In the transfer head 111 with reference to FIG. 3, the adsorption force may be generated only in the adsorption region of the transfer head 111 so that a region on the substrate S corresponding to the adsorption region of the transfer head 111 may be formed as the adsorption target region. The transfer head 111 may collectively adsorb the plurality of micro LEDs MLs present in the adsorption target region on the substrate S, thereby forming the micro LED group MLG with respect to the adsorption region.

The area of the micro LED group MLG formed by transferring the plurality of micro LEDs MLs as a group by the transfer head 111 may correspond to the area of the conventional one micro LED mounting region.

In detail, when adsorbing the plurality of micro LEDs MLs on the substrate S as a group, the transfer head 111 may adsorb collectively the plurality of micro LEDs MLs included in an area corresponding to the area of a conventional one micro LED mounting region.

As an example, when the width of one micro LED used in a micro LED display panel according to the technology underlying the present invention is 30 μm, each micro LED used in the micro LED display panel according to the present invention may be manufactured to have a size having a width of 2 μm on the substrate S in order to collectively transfer the plurality of micro LEDs as a group to the sub-pixel region 100. In this case, a region on the substrate S having a size corresponding to a size of 30 μm, which is the width of one micro LED used in the micro LED display panel according to the technology underlying the present invention, may be formed as the adsorption target region.

The transfer head 111 may collectively adsorb the plurality of micro LEDs MLs present in the adsorption target region on the substrate S of a size of 30 μm. This may be implemented by controlling the adsorption force to be partially generated in at least a portion of the lower surface region of the transfer head 111 corresponding to the adsorption target region on the substrate S. Referring to FIG. 3 again, the transfer head 111 may be in a controlled state such that the adsorption force for the micro LEDs MLs is generated only in the adsorption region to which the plurality of micro LEDs MLs are adsorbed.

A plurality of adsorption target regions may be formed on the substrate S. As an example, the adsorption target region on the substrate S having a size corresponding to a size of 30 μm, which is the width of one micro LED used in the micro LED display panel according to the technology underlying the present invention, may mean an adsorption target region located at any one position in the micro LED presence region. Therefore, the transfer head 111 may collectively adsorb pluralities of micro LEDs MLs present in the plurality of adsorption target regions in a form of adsorbing each of the pluralities of micro LEDs MLs included in an area having a size of 30 μm in one adsorption target region on the substrate S.

As described above, the transfer head 111 may adsorb the plurality of micro LEDs MLs, which is at least a part of the individualized micro LEDs MLs on the substrate S, as a group to form the micro LED group MLG in the adsorption region of the transfer head 111. The transfer head 111 may perform a transfer process by collectively transferring the micro LED group MLG formed as described above to the sub-pixel region 100.

In the present invention, by the method of transferring the individualized micro LEDs MLs as a group by the transfer head 111, the plurality of micro LEDs MLs may be collectively transferred to at least one of a plurality of sub-pixel regions 100 of the panel substrate 108. This may ensure that the number of times the transfer head 111 is moved between the substrate S and the panel substrate 108 to mount the plurality of micro LEDs MLs is reduced to one time, thereby making it possible to mount the plurality of micro LEDs MLs collectively at one time. As a result, the efficiency of the transfer process of mounting the micro LEDs MLs in the sub-pixel region 100 may be improved.

Further, the micro LEDs MLs in the micro LED group MLG may be electrically connected in parallel to each other. Therefore, in the present invention, there is no need to additionally perform a replacement process even when a defective micro LED, or a micro LED missing during the transfer process is present in the micro LED group MLG.

FIGS. 4 to 7 are views sequentially illustrating the method of manufacturing the micro LED display panel according to the present invention.

Referring to FIGS. 4 to 7, a detailed description will be given of the step of collectively transferring the micro LED group MLG to the sub-pixel region 100 using the method of transferring the individualized micro LEDs MLs as a group by the transfer head 111.

Prior to the detailed description, FIGS. 4 and 5 illustrate a panel substrate 108 having the same structure as the panel substrate 108 illustrated in FIG. 2 for easy description of the method of manufacturing the micro LED display panel. FIGS. 4 to 7 are views schematically illustrating the panel substrate 108 on which sub-pixel regions 100 are formed when viewed from above.

First, as illustrated in FIG. 4, in the method of manufacturing the micro LED display panel according to the present invention, by the step of providing the panel substrate 108 in which an array of unit pixel regions, each of which is composed of the first to third sub-pixel regions 101, 102, and 103, is provided, and the common lower electrode 105 is provided in each of the sub-pixel regions 100, the panel substrate 108 in which the common lower electrode 105 is provided in the sub-pixel region 100 may be provided.

In FIG. 4, the sub-pixel region 100 formed in a first row and a first column is the first sub-pixel region 101 on which the first micro LED group MLG1 emitting light of the first color is mounted, and the sub-pixel region 101 formed in the first row and a second column is the second sub-pixel region 102 on which the second micro LED group MLG2 emitting light of the second color is mounted, and a sub-pixel region 100 formed in the first row and a third column may be the third sub-pixel region 103 on which the third micro LED group MLG3 emitting light of the third color is mounted. The first to third sub-pixel regions 101, 102, and 103 may constitute one unit pixel region. The plurality of sub-pixel regions 100 may be formed on the panel substrate 108 in a matrix shape of a plurality of rows and a plurality of columns. In this case, sub-pixel regions 100 provided in the same column may be sub-pixel regions 100 emitting light of the same color. In detail, when the first column on the left in FIG. 4 is a first column of the panel substrate 108, sub-pixel regions 100 provided in the first column of the panel substrate 108 may be first sub-pixel regions 101. Then, second sub-pixel regions 102 and third sub-pixel regions 103 may be sequentially formed in a second column and a third column of the panel substrate 108.

The first to third sub-pixel regions 101, 102, and 103 formed in the respective columns may form one unit pixel region in the direction of each row of the panel substrate 108. By such a structure, the panel substrate 108 may be formed to have an array of unit pixel regions each of which is composed of the first to third sub-pixel regions 101, 102, and 103.

The common lower electrode 105 may be provided in each of the sub-pixel regions 101, 102, and 103.

Then, as illustrated in FIG. 5, a process in which the common joining layer 106 is provided on the common lower electrode 105 of each of the sub-pixel regions 101, 102, and 103 may be performed. The common joining layer 106 allows the micro LEDs MLs to be joined and fixed to the common lower electrode 105 provided in the sub-pixel region 100 so that the panel substrate 108 and the micro LED group MLG are electrically connected to each other.

Then, as illustrated in FIG. 6, the following processes may be performed: collectively transferring a plurality of first micro LEDs MLs1 emitting light of the first color to each of a plurality of first sub-pixel regions 101 to form the first micro LED group MLG1; collectively transferring a plurality of second micro LEDs MLs2 emitting light of the second color to each of a plurality of second sub-pixel regions 102 to form the second micro LED group MLG2; and collectively transferring a plurality of third micro LEDs MLs3 emitting light of the third color to each of a plurality of third sub-pixel regions 103 to form the third micro LED group MLG3.

To form the first to third micro LED groups MLG1, MLG2, and MLG3 in the respective sub-pixel regions 101, 102, and 103, the method of transferring the individualized micro LEDs MLs by the transfer head 111 described with reference to FIG. 3 may be used.

The transfer head 111 may adsorb pluralities of first micro LEDs MLs1 in the adsorption target regions on the substrate S provided with individualized first micro LEDs MLs1 emitting light of the first color. The transfer head 111 may collectively transfer the pluralities of first micro LEDs MLs1 adsorbed from the adsorption target regions to the respective associated first sub-pixel regions 101. Through this process, first micro LED groups MLGs1 may be formed in the first sub-pixel regions 101.

The transfer head 111 may collectively transfer pluralities of second micro LEDs MLs2 and third micro LEDs MLs3 to the respective associated second sub-pixel regions 102 and the respective associated third sub-pixel regions 103, respectively, through the same process as the process of absorbing the pluralities of first micro LEDs MLs1 present in the adsorption target regions and collectively transferring the pluralities of first micro LEDs MLs1 to the respective associated first sub-pixel regions 101. Accordingly, as illustrated in FIG. 6, second micro LED groups MLGs2 and third micro LED groups MLGs3 may be formed in the second sub-pixel regions 102 and the third sub-pixel regions 103, respectively.

Then, as illustrated in FIG. 7, a process of forming the common upper electrode 104 on an upper portion of each of the first sub-pixel regions 101 to the third sub-pixel regions on which the first micro LED groups MLGs1 to the third micro LED groups MLGs3 are mounted may be formed.

In detail, the common upper electrode 104 may be configured in a surface shape that entirely covers upper surfaces of the plurality of micro LEDs MLs in each of the micro LED groups MLGs. However, the shape illustrated in FIG. 7 is illustrated as an example, and thus the shape of the common upper electrode 104 is not limited thereto. The common upper electrode 104 is not limited in terms of the structure thereof, as long as the structure has a shape that entirely connects the plurality of the micro LEDs MLs in each of the micro LED groups MLGs to each other.

The common upper electrode 104 may be connected to a vertical common electrode 109 formed adjacent to the sub-pixel regions 100 of the panel substrate 108 by an auxiliary electrode 110. This may implement electrical connection between the micro LED group MLG and the panel substrate 108.

Each of the pluralities of micro LEDs MLs1, MLs2, and MLs3 in the micro LED groups MLG1, MLG2, and MLG3 mounted on the respective sub-pixel regions 101, 102, and 103 may be surrounded by a passivation layer 107. In other words, the passivation layer 107 surrounding the plurality of micro LEDs MLs may be formed in each of the sub-pixel regions 100. The passivation layer 107 may be charged in a space between the plurality of micro LEDs MLs in the micro LED group MLG mounted on the sub-pixel region 100 and a space between the plurality of micro LEDs MLs and the sub-pixel region 100, thereby covering the common lower electrode 105. The passivation layer 107 may be formed at a height that does not cover an upper portion of the micro LED group MLG, for example, the common upper electrode 104 on the plurality of micro LEDs MLs in the micro LED group MLG. The passivation layer 107 may be formed before forming the common upper electrode 104. Therefore, when the passivation layer 107 is formed, the upper portion of the micro LED group MLG may be exposed and may be covered by the common upper electrode 104 formed on an upper portion of the passivation layer 107.

The passivation layer 107 may be made of an organic insulating material. For example, the passivation layer 107 may be made of acrylic, poly(methyl methacrylate) (PMMA), benzocyclobutene (BCB), polyimide, acrylate, epoxy, and polyester, but is not limited thereto.

When the plurality of micro LEDs MLs mounted on the sub-pixel region 100 are the micro LED group MLG formed by grouping on the substrate S the individualized micro LEDs MLs manufactured on the substrate S, the space between the micro LEDs MLs and the micro LEDs MLs and the space between the micro LEDs MLs and the sub-pixel region 100 may be charged by a connection part 10 while the micro LEDs MLs are surrounded by the connection part 10. The connection part 10 may be made of the same material as the passivation layer 107 and may function as the passivation layer 107.

As described above, in the micro LED display panel 1 according to the present invention, the plurality of micro LEDs MLs may be collectively transferred by the method of transferring the individualized micro LEDs MLs as a group to each of the first to third sub-pixel regions 101, 102, and 103 of the panel substrate 108 provided in the step of providing the panel substrate 108. Accordingly, a structure in which the micro LED group MLG composed of the plurality of micro LEDs MLs is mounted on each of the sub-pixel regions 100 constituting the unit pixel regions may be formed.

The plurality of micro LEDs MLs in the micro LED group MLG may be electrically connected in parallel to each other. In the present invention, by such a structure, even when a defective micro LED or a missing micro LED is included in the micro LED group MLG, a color emission function may be performed. Therefore, it may not necessary to separately perform the replacement process due to the defective micro LED and the missing micro LED in a manufacturing process.

(ii) The Method of Transferring Combined Micro LEDs as a Group by the Transfer Head FIG. 8 is a view illustrating a state in which the transfer head adsorbs combined micro LEDs as a group.

The step of collectively transferring the micro LED group MLG to the sub-pixel region 100 may be performed by adsorbing, by the transfer head 111, the micro LED group MLG formed on the substrate S and transfers the micro LED group MLG to the sub-pixel region 100. In this case, the substrate S may mean a growth substrate or a temporary substrate.

The method (i) of transferring the individualized micro LEDs as a group by the transfer head described above is that the individualized micro LEDs MLs on the substrate S are adsorbed as a group by the transfer head 111 and collectively transferred to the sub-pixel region 100. The method (ii) of transferring the combined micro LEDs as a group by the transfer head differs from the method (i) in that the individualized micro LEDs MLs on the substrate S are pre-combined as a group on the substrate S to form the micro LED group MLG, and the micro LED group MLG is adsorbed by the transfer head 111 and transferred to the sub-pixel region 100. In other words, the method (ii) may adsorb the micro LED group MLG formed by connecting the plurality of micro LEDs MLs to each other on the substrate S and transfer the micro LED group MLG to the sub-pixel region 100.

The method (i) of transferring the individualized micro LEDs as a group by the transfer head is a method of adsorbing the micro LEDs as a group by controlling the adsorption force of the adsorption region of the transfer head, and thus a separate process of grouping the micro LEDs may be omitted. This may increase rapidity of a finished product manufacturing process. However, compared to the method (ii) of transferring the combined micro LEDs as a group by the transfer head, there may be a problem in that the micro LED is separated or the position thereof is changed during the transfer process.

On the other hand, the method (ii) of transferring the combined micro LEDs as a group by the transfer head, which will be described below, is a method of transferring the micro LED group MLG formed by pre-grouping and combining the individualized micro LEDs on the substrate S (e.g., a growth substrate or a temporary substrate) to the sub-pixel region 100, and thus a problem that positional misalignment occurs between the individualized micro LEDs due to the small size thereof, resulting in low transfer efficiency may be prevented from occurring.

As illustrated in FIG. 8, a plurality of micro LED groups MLGs each of which is configured by connecting the plurality of micro LEDs MLs to each other may be provided on the substrate S. The transfer head 111 may adsorb the plurality of micro LED groups MLGs on the substrate S. In this case, the transfer head 111 may adsorb all the plurality of micro LED groups MLGs formed on the substrate S, or selectively adsorb the plurality of micro LED groups MLGs at a regular pitch interval.

As illustrated in FIG. 8, in order to provide the micro LED group MLG composed of the plurality of micro LEDs MLs on the substrate S, the individualized micro LEDs MLs may be combined as a group on the substrate S.

The individualized micro LEDs MLs provided on the substrate S may be pre-combined as groups on the substrate S. Accordingly, a micro LED group substrate MLGS having the plurality of micro LED groups MLGs may be manufactured. Therefore, the transfer head 111 may adsorb the plurality of micro LED groups MLGs on the micro LED group substrate MLGS.

The micro LED group substrate MLGS may be composed of the substrate S and micro LEDs MLs of the same type that are individualized on the substrate S in a matrix shape of rows and columns. In the micro LED group substrate MLGS, the micro LEDs MLs may be connected to each other by a connection part 10 to form a micro LED group MLG while adjacent micro LED groups MLGs may not be connected to each other by the connection part 10.

A method of manufacturing the micro LED group substrate MLGS as described above may include: preparing the micro LEDs MLs of the same type individualized on the substrate S in a matrix shape of rows and columns; and grouping the micro LEDs MLs so that the micro LEDs MLs are connected to each other by the connection part 10 to form the micro LED group MLG while the adjacent micro LED groups MLGs are not connected to each other by the connection part 10.

The step of grouping the micro LEDs MLs may be performed in various embodiments according to a method of forming the connection part 10 connecting the plurality of micro LEDs MLs to each other.

In this case, the connection part 10 may include a molding material 10a removable by a laser or an etchant, a photoresist 10b, an adhesive material 10a', a metal, and an adhesive film 10e. The connection part 10 may be made of at least one of the above-described configurations, and the step of grouping the micro LEDs MLs may be performed in a manner suitable for the provided configuration. However, the material of the connection part 10 is not limited to the above-listed configurations, and the material thereof is not limited as long as the material is capable of connecting the micro LEDs MLs to each other to form the micro LED group MLG.

FIGS. 9A to 17D are views illustrating various embodiments of the micro LED group MLG formed by the step of grouping the micro LEDs.

Figure 9A:
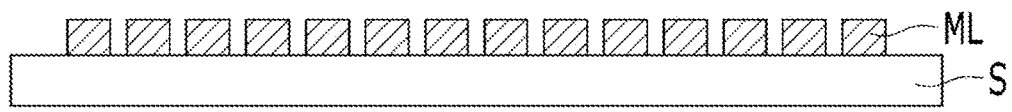
Figure 9B:
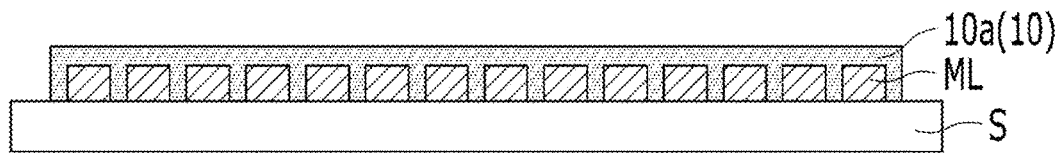
Figure 9C:
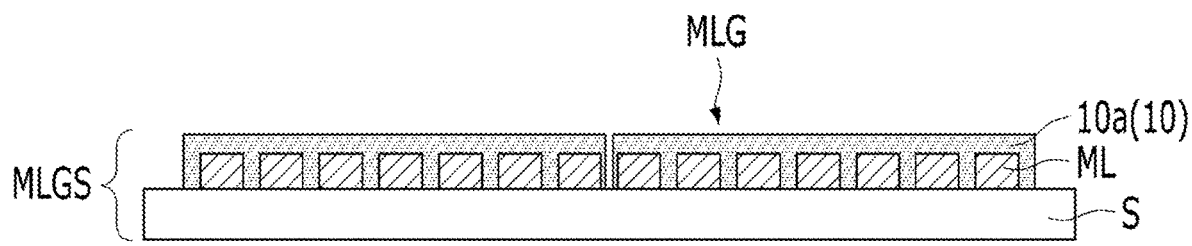

First, FIGS. 9A, 9B, 9C are views schematically illustrating a method of forming the micro LED group by providing the molding material removable by a laser or an etchant as the connection part.

As illustrated in FIG. 9A, a process of providing the micro LEDs MLs of the same type individualized on the substrate S may be performed.

Then, as illustrated in FIG. 9B, a process of forming the connection part 10 on the micro LEDs MLs of the substrate S by molding the molding material 10a may be performed. In this case, the molding material 10a may be formed in a shape that is charged between the micro LEDs MLs on the substrate S and covers the surfaces of the micro LEDs MLs. However, this is illustrated as an example, and thus the shape of the molding material 10a is not limited thereto. For example, the molding material 10a may be provided in a shape suitable for connecting the micro LEDs MLs to each other.

Then, as illustrated in FIG. 9C, a process of removing a portion of the molding material 10a may be performed. The molding material 10a may be removable by a laser or an etchant.

By removing the portion of the molding material 10a, the micro LEDs MLs connected to each other by the molding material 10a may form a micro LED group MLG. In this case, the micro LED group MLG may have an area corresponding to an area of one micro LED used in the technology underlying the present invention. Therefore, the portion of the molding material 10a removed by the laser or the etchant may be a region between adjacent micro LED groups MLGs on the substrate S, each of the micro LED groups MLGs having an area corresponding to the area of one micro LED used in the technology underlying the present invention.

In detail, when the width of one micro LED used in the technology underlying the present invention is 30 μm, the portion of the molding material 10a may be removed so that one micro LED group MLG has a width of 30 μm and a plurality of micro LED groups MLGs each of which has a width of 30 μm may be formed on the substrate S. In this case, the width of the portion of the molding material 10a removed by the laser or the etchant may have a width smaller than a width between the micro LED groups MLGs.

When the connection part 10 is the molding material 10a removable by the laser or the etchant as described above, the portion of the molding material 10a may be removed so that the micro LEDs MLs connected to each other by the molding material 10a form the micro LED group MLG, and a region in which the molding material 10a is not molded becomes a separation section between the adjacent micro LED groups MLGs.

The molding material 10a connecting the micro LEDs MLs of the substrate S may be the photoresist 10b. FIGS. 10A, 10B, 10C, and 10D are views schematically illustrating a method of forming the micro LED group by providing the photoresist as the connection part.

Figure 10A:
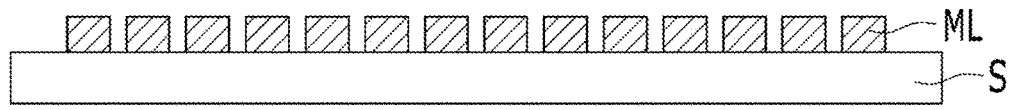

As illustrated in FIG. 10A, a process of providing the micro LEDs MLs of the same type individualized on the substrate S may be performed.

Figure 10B:
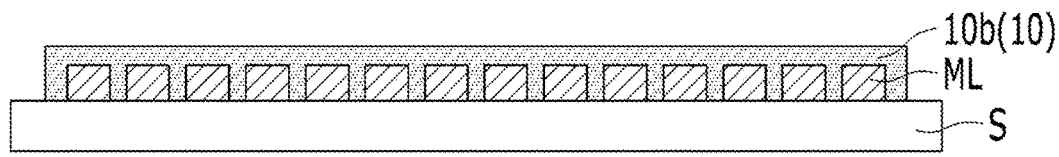

Then, as illustrated in FIG. 10B, a process of charging the photoresist 10b between the micro LEDs MLs of the substrate S may be performed. In this case, the photoresist 10b may be formed in a shape that is charged between the micro LEDs MLs on the substrate S and covers the surfaces of the micro LEDs MLs.

Figure 10C:
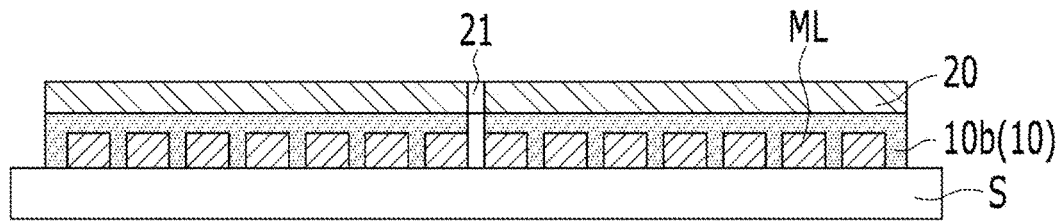
Figure 10D:
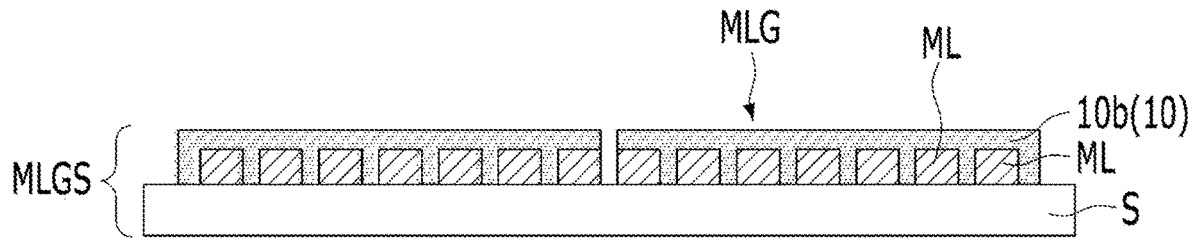

Then, as illustrated in FIG. 10C, a process of exposing a portion of the photoresist 10b may be performed. Therefore, as illustrated in FIG. 10B, the individualized micro LEDs MLs on the substrate S are charged by the photoresist 10b, and then, as illustrated in FIG. 10C, light is projected onto the portion of the photoresist 10b to remove the portion. In this case, a process of providing an exposure mask 20 with an opening 21 and removing the portion of the photoresist 10b may be performed.

The exposure mask 20 may be provided on the photoresist 10b. Light may be projected onto the photoresist 10b through the opening 21 of the exposure mask 20, and the portion of the photoresist 10b corresponding to the opening 21 may be removed thereby.

Accordingly, a micro LED group MLG composed of the plurality of micro LEDs MLs connected to each other by the photoresist 10b except for the removed portion may be formed. In this case, the micro LED group MLG may have an area corresponding to an area of one micro LED used in the technology underlying the present invention. As an example, when the width of one micro LED used in the technology underlying the present invention is 30 μm, the portion of the photoresist 10b may be removed so that the micro LED group MLG has a width of 30 μm.

As illustrated in FIG. 10C, the portion of the photoresist 10b may be removed so that the micro LEDs MLs connected to each other by the photoresist 10b form the micro LED group MLG, and a region that results from removal of the portion of the photoresist 10b becomes a separation section between the adjacent micro LED groups MLGs.

Figure 11A:
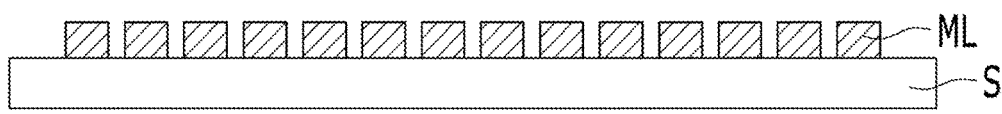
Figure 11B:
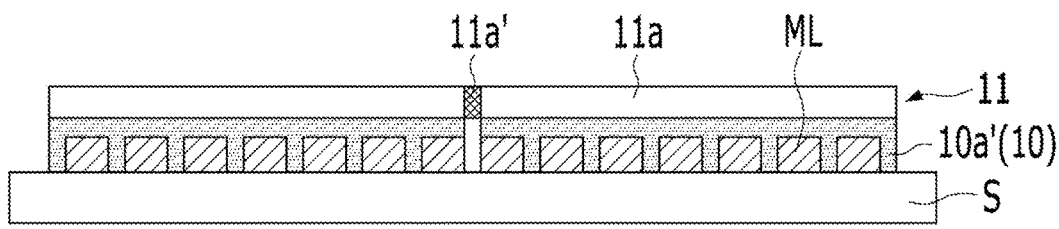
Figure 11C:
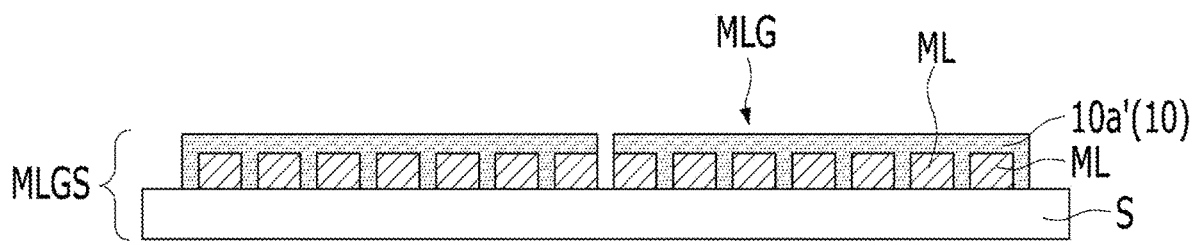

Alternatively, the molded material 10a may be molded only in a partial region to form the micro LED group MLG. In this case, the molding material 10a may be a material with adhesiveness. Since the molding material 10a functions as the connection part 10, the connection part 10 may include an adhesive material 10a'. This will be described in detail with reference to FIGS. 11A, 11B, and 11C. FIGS. 11A, 11B, and 11C are views illustrating a method of forming the micro LED group by molding the adhesive material 10a' only in a partial region.

As illustrated in FIG. 11A, a process of providing the micro LEDs MLs of the same type individualized on the substrate S may be performed.

Then, as illustrated in FIG. 11B, a mask 11 with an opening 11a may be provided on the micro LEDs MLs of the substrate S. The mask 11 may include the opening 11a and a non-opening portion 11a'. When provided on the micro LEDs MLs, the mask 11 having such a configuration may be molded between the micro LEDs MLs by allowing the adhesive material 10a' to pass through the opening 11a. In other words, the adhesive material 10a' may be molded only at a position corresponding to a position where the opening 11a is formed.

The plurality of micro LEDs MLs in which the adhesive material 10a' is molded in a partial region through the opening 11a may be connected to each other by means of adhesiveness of the adhesive material 10a'.

On the other hand, the adhesive material 10a' does not pass through a position on the substrate S corresponding to a position where the non-opening portion 11a' is formed. This may implement a shape in which the adhesive material 10a' is molded only between the micro LEDs MLs present in a portion of the micro LED presence region on the substrate S.

Then, as illustrated in FIG. 11C, the mask 11 may be removed, and a micro LED group MLG may be formed on the substrate S thereby.

As described above, in the step of grouping the micro LEDs MLs, the mask 11 with the opening 11a may be provided, and the molding material 10' is molded only in a partial region on the substrate S corresponding to the opening 11a so that the micro LEDs MLs connected to each other by the molding material 10' form the micro LED group MLG, and a region in which the molding material 10' is not molded becomes a separation section between the adjacent micro LED groups MLGs.

In the method of molding the molding material 10a' only in a partial region, the adhesive material 10a' is preferably used.

FIGS. 12A, 12B, 12C, and 12D are views illustrating a method of forming the micro LED group by depositing the metal material on the micro LEDs of the substrate.

As illustrated in FIG. 11A, a process of providing the micro LEDs MLs of the same type individualized on the substrate S may be performed.

Figure 12A:
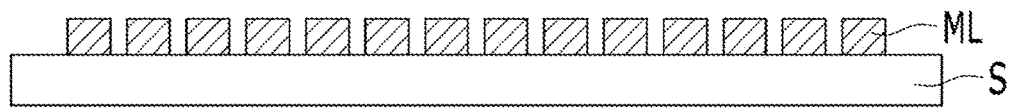
Figure 12B:
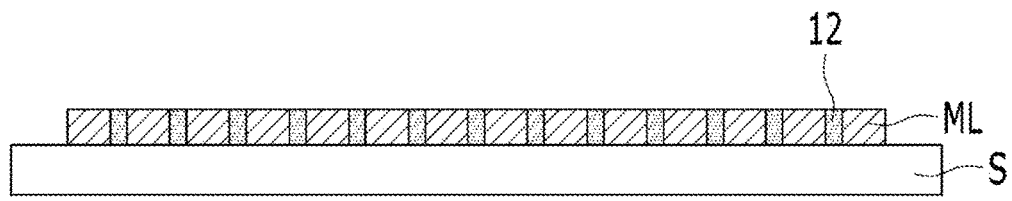

Then, as illustrated in FIG. 12B, a process of charging a charging material 12 between the micro LEDs MLs of the substrate S may be performed.

Figure 12C:
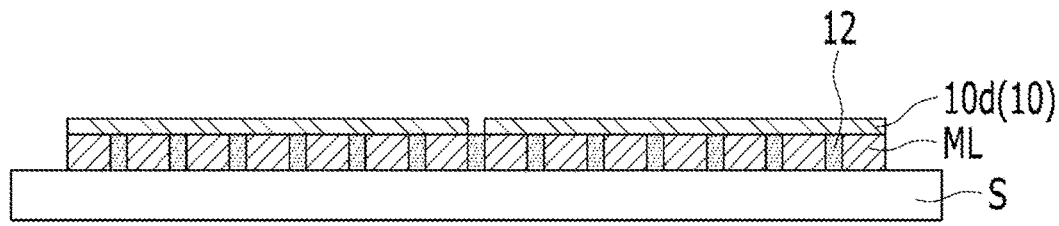

A metal material 10d may be formed by means of sputtering. Therefore, as illustrated in FIG. 12C, which will be described later, in order to form the metal material 10d in a planar shape, no empty space should be presented between the micro LEDs MLs. The charging material 12 may be previously charged in an empty space between the micro LEDs MLs on the substrate S.

In detail, the charging material 12 may be formed before the metal material 10d is deposited to charge the empty space between the micro LEDs MLs and an empty space between the micro LEDs MLs and the substrate S. The metal material 10d may facilitate deposition of the metal material 10d on the micro LEDs MLs. The charging material 12 may be made of a material removable by a method such as etching.

Then, as illustrated in FIG. 12C, the metal material 10d may be deposited on the micro LEDs MLs. The metal material 10d may be formed to be planar on upper surfaces of a plurality of micro LEDs MLs on the substrate S while connecting the plurality of micro LEDs MLs to each other. Such a shape may be easily formed by charging the space between the micro LEDs MLs.

The metal material 10d may be the same configuration as the common upper electrode 104 formed on the upper portion of the micro LED group MLG mounted on the sub-pixel region 100. As an example, the common upper electrode 104 may be made of a transparent material to emit light of color emitted from the micro LED group MLG and may be specifically made of indium tin oxide (ITO).

The metal material 10d may be deposited on the plurality of micro LEDs MLs present in a portion of the micro LED presence region on the substrate S to connect the plurality of micro LEDs MLs to each other. In this case, deposition may be performed by a suitable deposition method for depositing the metal material 10d in only a partial region.

Figure 12D:
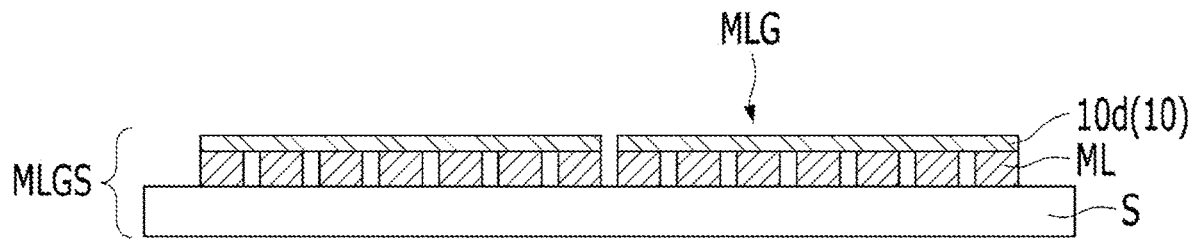

Then, as illustrated in FIG. 12D, a process of removing the charging material 12 charged between the micro LEDs MLs by etching and forming a micro LED group MLG on the substrate S by the metal material 10d deposited on the micro LEDs MLs may be performed.

When the charging material 12 charged between the micro LEDs MLs includes epoxy, acrylic (polyacrylate), poly (methyl methacrylate) (PMMA), benzocyclobutene (BCB), polyimide, and polyester, the charging material 12 may function as the passivation layer 107. Therefore, in FIG. 12D, although the charging material 12 is removed, the charging material 12 may not be removed when configured as described above.

As illustrated in FIG. 12D, in the step of grouping the micro LEDs, the metal material 10d may be deposited on the micro LEDs MLs of the substrate S so that the micro LEDs MLs connected to each other by the metal material 10d form the micro LED group MLG, and a region in which the metal material 10d is not deposited becomes a separation section between the adjacent micro LED groups MLGs.

As illustrated in FIG. 12D, when the connection part 10 connecting the micro LEDs MLs to each other is the metal material 10d, the metal material 10d may function as the common upper electrode 104. Therefore, when using the micro LED group MLG formed by connecting the plurality of micro LEDs MLs to each other by the metal material 10d, the process of forming the common upper electrode 104 after transferring the micro LED group MLG to the sub-pixel region 100 may be omitted. As a result, rapidity and efficiency of the manufacturing process may be improved.

Figure 13:
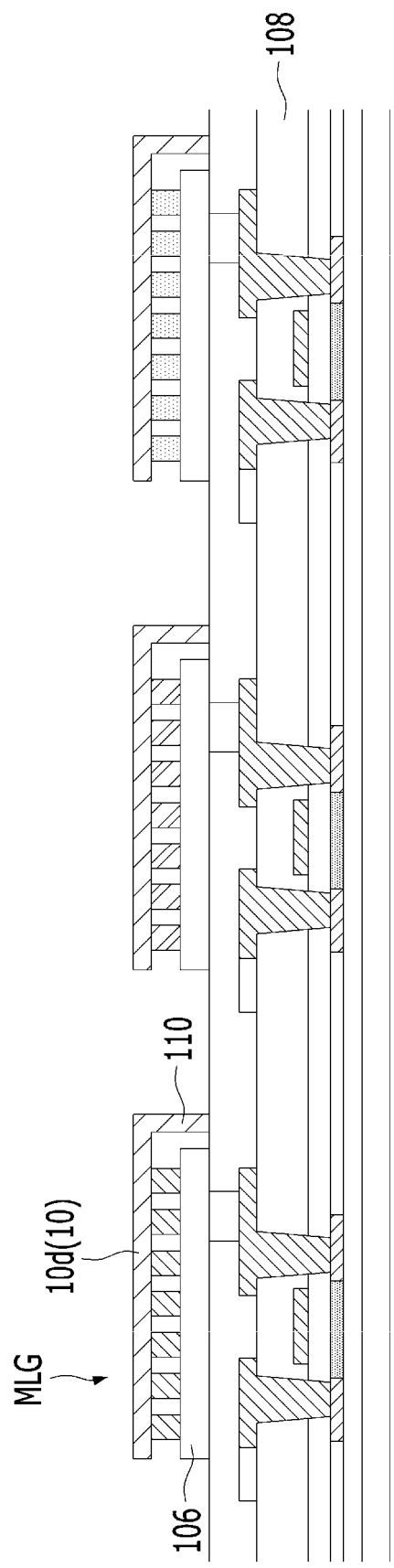

FIG. 13 is a view illustrating a state in which the micro LED group MLG formed by depositing the metal material 10d illustrated in FIGS. 12A, 12B, 12C, and 12D to form the micro LED group MLG is mounted on the sub-pixel region 100.

As illustrated in FIG. 13, the micro LED group MLG formed by the connection part 10 made of the metal material 10d connecting the plurality of micro LEDs MLs to each other may be mounted on the sub-pixel region 100.

As illustrated in FIG. 13, by a structure in which the micro LED group MLG formed by the metal material 10d functioning as the common upper electrode 104 is mounted on the sub-pixel region 100, the micro LEDs MLs in the micro LED group MLG may be electrically connected in parallel to each other with respect to the common lower electrode 105 and the common upper electrode 104. When the metal material 10d is provided as the common upper electrode 104, the auxiliary electrode 110 formed by being connected to the metal material 10d and connected to the vertical common electrode 109 of the panel substrate 108 to electrically connect the metal material 10d and the panel substrate 108 to each other may be provided.

Figure 14C:
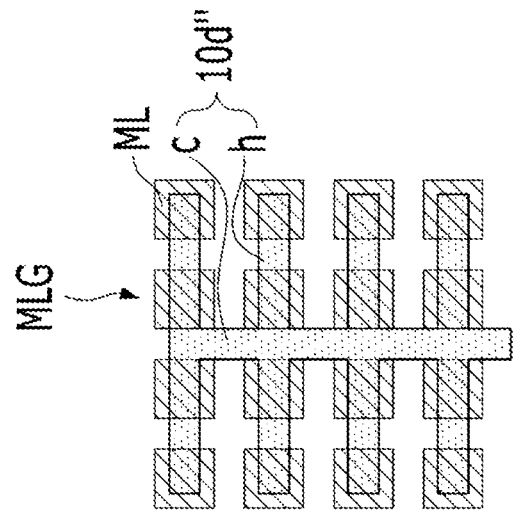
Figure 14B:
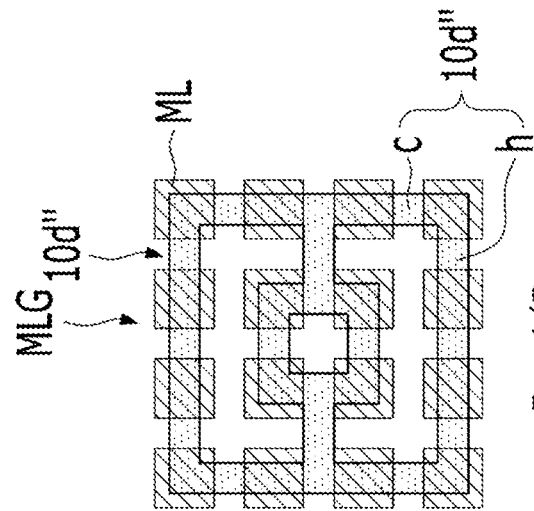
Figure 14A:
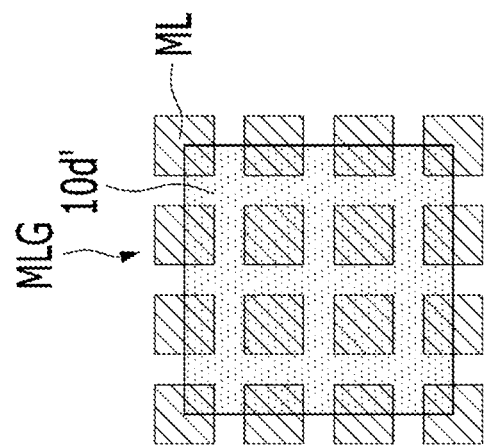

The metal material 10d may be deposited on the plurality of micro LEDs MLs in various shapes to connect the micro LEDs MLs to each other. FIGS. 14A, 14B, and 14C are views illustrating various embodiments of the metal material deposited on the micro LEDs.

FIG. 14A is a view illustrating a metal material 10d' deposited in a surface shape on the plurality of micro LEDs MLs when viewed from above. In detail, as illustrated in FIG. 14A, the metal material 10d' may be configured in a surface shape that entirely connects the micro LEDs MLs in the micro LED group MLG to each other.

The metal material 10d' in a surface shape may be formed on the upper portion of the micro LED group MLG, and may be formed in a shape that covers at least a portion of each of the plurality of micro LEDs MLs in the micro LED group MLG. By such a structure, the plurality of micro LEDs MLs may be connected to each other by the surface-shaped metal material 10d' to form the micro LED group MLG.

The metal material 10d' may function as the common upper electrode 104. Therefore, the metal material 10d' has to be formed in a shape that entirely connects the plurality of micro LEDs MLs constituting the micro LED group MLG. This is to enable the micro LEDs MLs in the micro LED group MLG to be electrically connected in parallel to each other with respect to the common upper electrode 104 and the common lower electrode 105 when the micro LED group MLG formed by the metal material 10d' is mounted on the sub-pixel region 100.

However, the surface-shaped metal material 10d' may not be formed in a shape that entirely covers the upper surfaces of the plurality of micro LEDs MLs. The surface-shaped metal material 10d' is not limited in terms of the structure thereof, as long as the structure has a shape that entirely connects the plurality of micro LEDs MLs in the micro LED group to each other in contact with at least a portion of the upper surface of each of the plurality of micro LEDs MLs as illustrated in 14A.

Further, the surface-shaped metal material 10d' may have a quadrangular cross-section, but is not limited thereto. For example, the surface-shaped metal material 10d' may be formed in a circular-cross section or the like.

Alternatively, a strip-shaped metal material d" may entirely connects the micro LEDs MLs in the micro LED group MLG to each other. In this case, the strip-shaped metal material 10d" is not limited in terms of the structure thereof, as long as the structure has a strip shape that entirely connects the micro LEDs MLs to each other.

The strip-shaped metal material 10d" may be composed of a horizontal strip h and a vertical strip c. The horizontal strip h and the vertical strip c may be formed to be continuously connected to each other while entirely connecting the micro LEDs MLs in the micro LED group MLG to each other.

As illustrated in FIG. 14B, the plurality of micro LEDs MLs may be provided in a matrix shape of a plurality of rows and a plurality of columns. The micro LEDs MLs may be connected to each other by the metal material 10d" to form one micro LED group MLG.

As an example, as illustrated in FIG. 14B, the plurality of micro LEDs MLs may be composed of first to fourth rows and first to fourth columns. The micro LEDs MLs composed of the plurality of rows and the plurality of columns may be connected to each other by the strip-shaped metal material 10d" to form the micro LED group MLG.

The strip-shaped metal material 10d" composed of the horizontal strip h and the vertical strip c may connect the plurality of micro LEDs MLs composed of the first to fourth rows and the first to fourth columns to each other.

In detail, the horizontal strip h may be provided on micro LEDs MLs arranged in the first row and the first column to the first row and the fourth column, and the vertical strip c may be provided on micro LEDs MLs arranged in the first row and the first column to the fourth row and the first column. The horizontal strip h and the vertical strip c may be formed to be continuously connected to each other, thereby forming a shape in which micro LEDs MLs arranged in the outer rows and columns along the edges of the matrix are connected to each other by the strip-shaped metal material 10d".

Further, among the plurality of micro LEDs MLs composed of the first to fourth rows and the first to fourth columns, micro LEDs MLs arranged in the inner rows and columns may also be connected to each other by the strip-shaped metal material 10d".

In detail, the horizontal strip h may be provided on micro LEDs MLs arranged in the second row and the second column and the second row and the third column, and the vertical strip c may be provided on micro LEDs MLs arranged in the third row and the second column to the third row and the third column. The horizontal strip h and the vertical strip c may be formed to be continuously connected to each other.

Between the strip-shaped metal material 10d'' provided in the outer rows and columns and the strip-shaped metal material 10d'' provided in the inner rows and columns, the strip-shaped metal material 10d'' connecting the strip-shaped metal materials 10d'' to each other may be provided. In this case, in FIG. 14B, although the horizontal strip h is provided between the second row and the third row and the metal materials 10d'' are thereby connected to each other, this is illustrated as an example and thus the structure that connects the metal materials 10d'' is not limited thereto.

Alternatively, the strip-shaped metal material 10d'' may entirely connect the plurality of micro LEDs composed of the plurality of rows and the plurality of columns, by a structure in which the horizontal strip h is provided in each row in a shape that connects micro LEDs MLs arranged in the same row to each other, and the respective horizontal strips h are commonly connected to the vertical strip c. By such a structure, the micro LED group MLG may be formed. This will be described in detail with reference to FIG. 14C.

As illustrated in FIG. 14C, the horizontal strip h connecting the micro LEDs MLs present in the same row among the plurality of micro LEDs MLs composed of the first to fourth rows and the first to fourth columns may be provided. The micro LEDs MLs provided in the same row may be connected to each other by the horizontal strip h.

The vertical strip c to which the horizontal strips h in the respective rows are commonly connected may be provided between the second column and the third column. In this case, preferably, the vertical strip c may be provided at a position where a plurality of columns are provided in the same number on the left and right sides of the vertical strip c, and the micro LEDs MLs in the plurality of columns provided on the left and right sides of the vertical strip c have the same distance from the vertical strip c. Referring to FIG. 14C, as an example, in a structure with the first to fourth rows and the first to fourth columns, the vertical strip c may be provided at a position between the second and third columns.

Such a structure may be a structure in which the amount of current between the micro LEDs MLs having the same distance from the vertical strip c is the same. Accordingly, it is possible to exert an effect of minimizing light deviation.

The micro LED group MLG formed by the metal material 10d may function as the common upper electrode 104. Therefore, a deposition shape of the metal material 10d may be the same.

In other words, when the micro LED group MLG is formed by using the connection part 10 other than the metal material 10d, the common upper electrode 104 may be provided on the upper portion of the micro LED group MLG.

In this case, as illustrated in FIG. 14A, the common upper electrode 104 may be configured in a surface shape that entirely connects the micro LEDs MLs in the micro LED group MLG to each other.

Alternatively, as illustrated in FIGS. 14B and 14C, the common upper electrode 104 may be configured in a strip shape that entirely connects the micro LEDs MLs in the micro LED group MLG to each other. The shape of the common upper electrode 104 is not limited thereto and may be formed in a shape that covers the micro LED group MLG.

Alternatively, in the step of grouping the micro LEDs, a process of providing an adhesive film 10e and connecting the micro LEDs MLs to each other by the adhesive film 10e may be performed.

FIGS. 15A and 15B are views illustrating a method of forming the micro LED group by providing the adhesive film.

As illustrated in FIG. 15A, a process of providing the micro LEDs MLs of the same type individualized on the substrate S may be performed.

Then, as illustrated in FIG. 15B, the adhesive film 10e may be provided on the micro LEDs MLs of the substrate S to connect the micro LEDs MLs to each other. In this case, the adhesive film 10e may be a photosensitive film as an example.

The adhesive film 10e may be provided in consideration of the area of one micro LED group MLG to be formed.

Alternatively, the adhesive film 10e may be provided in a shape that entirely connects the individualized micro LEDs MLs on the substrate S to each other, and then a portion of the adhesive film 103 may be removed thereby forming a plurality of micro LED groups MLGs on the substrate S. In this case, the state in which the portion of the adhesive film 10e provided in a shape that entirely connects the individualized micro LEDs MLs on the substrate S to each other is removed may be implemented as illustrated in FIG. 15B.

As illustrated in FIG. 15B, the adhesive film 10e may be provided on the micro LEDs MLs of the substrate S so that the micro LEDs MLs connected to each other by the adhesive film 10e form the micro LED group MLG, and a region in which the adhesive film 10e is not provided becomes a separation section between the adjacent micro LED groups MLGs. This may implement formation of the plurality of micro LED groups MLGs on the substrate S.

The micro LED group MLG formed by the adhesive film 10e may be transferred to the sub-pixel region 100 and then the adhesive film 10e may be removed before the common upper electrode 104 is formed.

The micro LED group MLG formed by the step of grouping the micro LEDs may be formed in a modified structure from the embodiments described above with reference to FIGS. 9A to 15B.

FIGS. 16A, 16B, 16C, 16D, and 16E are views illustrating a modified structure of the micro LED group by the molding material.

When the molding material 10a is provided as the connection part 10, a process of forming the connection part 10 on the micro LEDs MLs of the substrate S by molding the molding material 10a may be performed. In this case, the micro LED group MLG formed by the molding material 10a may be embodied in various structures by differently molding the molding material 10a.

First, FIG. 16A is a view illustrating a state in which the molding material 10a is molded on the micro LEDs MLs at a higher height than the micro LEDs MLs of the substrate S. The molding material 10a may be formed in a shape that is over-molded to a higher height than the micro LEDs MLs on the substrate S and covers the micro LEDs MLs. By such a structure, it is possible to prevent damage to the micro LEDs MLs occurring when the micro LED group MLG is adsorbed by the transfer head 111.

In other words, the over-molded molding material 10a may be provided in a shape that protrudes further than the micro LEDs MLs in the micro LED group MLG, thereby forming a structure in which the transfer head 111 and the micro LEDs MLs constituting the micro LED group MLG do not directly come into contact with each other. By such a structure, it is possible to mitigate impact between the transfer head 111 and the micro LEDs MLs.

As a result, it is possible to obtain effect of preventing damage to the micro LEDs MLs constituting the micro LED group MLG occurring when the micro LED group MLG is transferred to the sub-pixel region 100.

As illustrated in FIG. 16A, when the molding material 10*a* is formed to be over-molded on the micro LEDs MLs, the molding material 10*a* is preferably made of a material that is easily separated from the substrate S during a laser lift-off (LLO) process in which the micro LED group MLG is removed from the substrate S.

FIG. 16B is a view illustrating a state in which the molding material 10*a* is molded to the same height as the micro LEDs MLs in the micro LED group MLG. In this case, there may be an advantage in that flatness of an upper surface of the micro LED group MLG is improved, thereby facilitating provision of the common upper electrode 104 provided on the micro LED group MLG.

As illustrated in FIG. 16B, when the molding material 10*a* is molded between the micro LEDs MLs at the same height as the micro LEDs MLs and is in contact with the substrate S, the molding material 10*a* is preferably made of a material that is easily separated from the substrate S during the LLO process.

FIG. 16C is a view illustrating a state in which the molding material 10*a* is incompletely charged between the micro LEDs MLs. In this case, the molding material 10*a* may be formed in a shape that covers upper portions of the micro LEDs MLs and is charged between the micro LEDs MLs to a depth that is spaced apart from the substrate S. Accordingly, a predetermined spacing space may be between the molding material 10*a* and the substrate S.

Such a structure may have an advantage in that the molding material 10*a* does not affect the LLO process, thereby improving efficiency of the LLO process.

Alternatively, as illustrated in FIG. 16D, the molding material 10*a* may be formed in a shape that is incompletely charged between the micro LEDs MLs without forming the spacing space between the molding material 10*a* and the substrate S. In this case, the molding material 10*a* is preferably made of a material that is easily separated from the substrate S.

FIG. 16E is a view illustrating a structure in which a sacrificial layer 13 is provided between the micro LEDs MLs in the spacing space between the substrate S and the molding material 10*a*.

As illustrated in FIG. 16E, the molding material 10*a* may be formed between the micro LEDs MLs in a shape that covers the upper portions of the micro LEDs MLs and is charged to a depth that allows formation of the spacing space between the substrate S and the molding material 10*a*.

The sacrificial layer 13 may be formed in the spacing space between the substrate S and the molding material 10*a*. The sacrificial layer 13 may be made of a material that is easily separated from the substrate S by reacting with a laser in the LLO process.

By such a structure, it is possible to obtain an effect of preventing damage between the transfer head 111 and the micro LEDs MLs by the molding material 10*a* and an effect of easily performing the LLO process by the sacrificial layer 13.

In the step of grouping the micro LEDs, a process of forming the micro LED group MLG by connecting the micro LEDs MLs to each other by the connection part 10 on the substrate S may be performed. After forming the micro LED group MLG on the substrate S as described above, a process of providing the common upper electrode 104 on the micro LED group MLG provided on the substrate S may be performed.

In this case, the structure of the common upper electrode 104 may be embodied in various shapes depending on the structure of the micro LED group MLG. The micro LED group MLG provided with the common upper electrode 104 on the substrate S may be adsorbed by the transfer head 111, with the common upper electrode 104 included, and then transferred to the sub-pixel region 100.

When the micro LED group MLG including the common upper electrode 104 is transferred to the sub-pixel region 100, a process of forming the common upper electrode 104 after the micro LED group MLG is mounted on the sub-pixel region 100 may be omitted. As a result, it is possible to increase efficiency of a micro LED display panel manufacturing process using the micro LED group MLG.

Figure 17A:
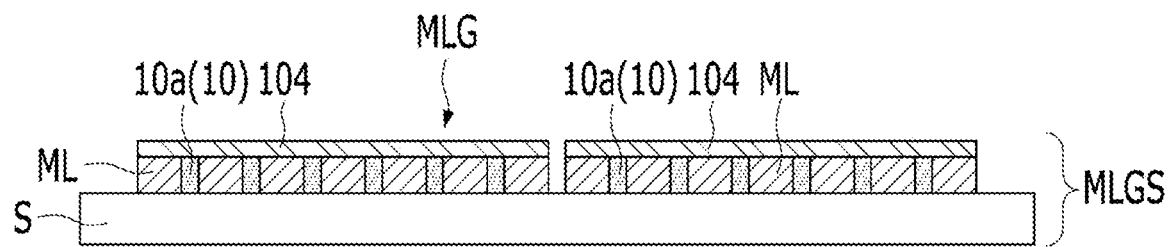

FIG. 17A is a view illustrating a state in which the common upper electrode 104 is provided on the upper portion of the micro LED group MLG formed by completely charging the molding material 10*a* between the micro LEDs MLs. When the molding material 10*a* is charged between the micro LEDs MLs to the same height as the micro LEDs MLs, the upper surface of the micro LED group MLG may be formed to be planar.

By such a structure, the common upper electrode 104 may be formed on the upper portion of the micro LED group MLG.

Figure 17B:
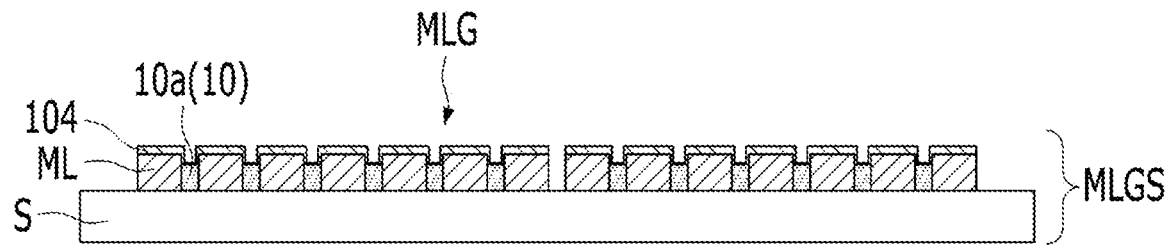

FIG. 17B is a view illustrating a state in which the common upper electrode 104 is provided on the micro LED group MLG formed by incompletely charging the molding material 10*a* between the micro LEDs MLs.

In this case, the micro LED group MLG may have a structure in which the molding material 10*a* is incompletely charged between the micro LEDs MLs without the spacing space existing between the molding material 10*a* and the substrate S.

When the common upper electrode 104 is provided on the micro LED group MLG having such a structure, the common upper electrode 104 may be formed along an exposed upper surface in the micro LED group MLG. As illustrated in FIG. 17B, the common upper electrode 104 may be formed on the upper surfaces of the micro LEDs MLs and the molding material 10*a* having different heights in the micro LED group MLG. Accordingly, the common upper electrode 104 may be provided in a non-planar structure.

Figure 17C:
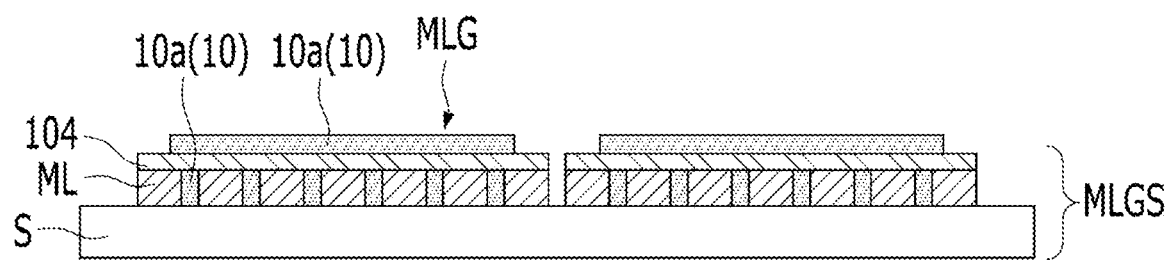

FIG. 17C is a view illustrating a state in which the molding material 10*a* is additionally formed on the micro LED group MLG on which the common upper electrode 104 is formed.

As illustrated in FIG. 17C, the micro LED group MLG in which the common upper electrode 104 is provided to be planar by the molding material 10*a* completely charged between the micro LEDs MLs may be provided on the substrate S.

The molding material 10*a* made of the same material as the material constituting the molding material 10*a* charged between the micro LEDs MLs may be additionally formed on the common upper electrode 104.

In this case, the molding material 10*a* formed on an upper portion of the common upper electrode 104 may have a width smaller than a horizontal width of the common upper electrode 104. Accordingly, at least a portion of each of opposite ends of the common upper electrode 104 may be exposed.

By such a structure, there may be an effect of preventing damage to the micro LEDs during adsorption by the transfer head 111 by the molding material 10a provided on the common upper electrode 104.

Further, the structure in which the opposite ends of the common upper electrode 104 are exposed may facilitate connection of the auxiliary electrode 110 when mounting the micro LED group MLG having the common upper electrode 104 on in the sub-pixel region 100.

Figure 17D:
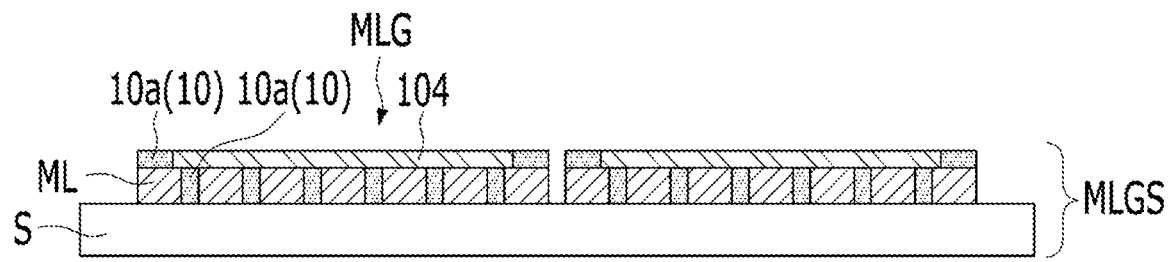

On the other hand, as illustrated in FIG. 17D, in the micro LED group MLG formed by the over-molded molding material 10a, at least a portion of the protruding molding material 10a may be removed, and the common upper electrode 104 may be provided in a region that results from removal.

In detail, the micro LED group MLG may be formed in a structure in which the molding material 10a protrudes further than the micro LEDs MLs by the molding material 10a over-molded between the micro LEDs MLs.

At least a portion of the molding material 10a protruding upward of the micro LEDs MLs may be removed by a laser or an etchant. In this case, at least a portion of the molding material 10a may be removed with a width smaller than that of the micro LED group MLG to form a structure in which a remaining portion of the molding material 10a surrounds the region that results from removal of at least a portion of the molding material 10a.

The common upper electrode 104 may be formed in the region that results from removal of at least a portion of the molding material 10a. Accordingly, a structure in which the remaining portion of the molding material 10a surrounds the common upper electrode 104 may be formed.

By such a structure, the molding material 10a may function of protecting the common upper electrode 104 to prevent damage to the common upper electrode 104.

In the step of grouping the micro LEDs, the micro LED group MLG may be formed by receiving manufactured micro LEDs MLs and then forming the connection part 10. Alternatively, the micro LED group MLG may be formed by manufacturing the micro LEDs MLs and then forming the connection part 10. A method of forming the micro LED group MLG by manufacturing the micro LEDs MLs and then forming the connection part 10 may be performed by manufacturing the individualized micro LEDs MLs, and then forming the connection part 10 on at least one of upper and lower portions of the individualized micro LEDs MLs so that the individualized micro LEDs MLs are combined through the connection part 10. In this case, the connection part 10 may be made of a metal material. When the connection part 10 is made of a metal material, after the micro LED group MLG is transferred to a display panel substrate, the connection part 10 may function as the common upper electrode 104 or the common lower electrode 105 that applies electricity to the micro LED group MLG.

As described above, since the method of manufacturing the micro LED display panel according to the present invention includes forming the micro LED group MLG by connecting the individualized micro LEDs MLs of the same type to each other, mounting the micro LED group MLG in the sub-pixel region 100 of the panel substrate 108 provided with the common lower electrode 105, and forming the common upper electrode 104 in the sub-pixel region 100 on which the micro LED group MLG is mounted, it is possible for the transfer head 111 to transfer the plurality of micro LEDs MLs to the sub-pixel region 100 only by reciprocating one time between the substrate S (e.g., a growth substrate or a temporary substrate) and the panel substrate 108.

Further, the micro LEDs MLs in the micro LED group MLG mounted on the sub-pixel region 100 may be electrically connected in parallel to each other with respect to the common lower electrode 105 and the common upper electrode 104 respectively provided on the lower and upper portions of the micro LED group MLG. Accordingly, even when a defective micro LED or a missing micro LED is present in the micro LED group MLG, a defect in the function of the micro LED display panel 1 to emit light may not occur.

On the other hand, the present invention is characterized in that the plurality of micro LEDs of the same type are transferred to a single sub-pixel region collectively at one time, thereby eliminating the need for the replacement process of the micro LEDs. In the present invention, the single sub-pixel region is configured to have substantially the same area as the conventional sub-pixel region, and thus, according to the present invention, there is provided a configuration in which the plurality of micro LEDs of the same type are transferred and mounted on the conventional sub-pixel region. This makes it possible to achieve an effect that the need for the replacement process is eliminated while maintaining the area of the sub-pixel region as that of the conventional sub-pixel region. Additionally, in contrast to a configuration in which one micro LED ML is transferred to the conventional single sub-pixel region, according to the present invention, since the plurality of micro LEDs of the same type are transferred to the single sub-pixel region having the same size as the conventional sub-pixel region, there may be an effect of improving luminous efficacy in the sub-pixel region.

Further, in the configuration in which one micro LED ML is transferred to the single sub-pixel region, when the micro LED ML mounted on the sub-pixel region reaches its lifespan during use, the sub-pixel region will also reach its lifespan. On the other hand, according to the configuration of the present invention in which the plurality of micro LEDs of the same type are mounted on the single sub-pixel region, the sub-pixel region will reach its lifespan only when all the plurality of micro LEDs mounted on the sub-pixel region reach their lifespan. Therefore, there may be an effect of extending the lifespan of the display panel compared to the conventional configuration.

As described above, the present invention has been described with reference to exemplary embodiments. However, those skilled in the art will appreciate that various modifications, additions and substitutions are possible, without departing from the scope and spirit of the invention as disclosed in the accompanying claims.

What is claimed is:

1. A micro LED group substrate, comprising:
a substrate;
micro LEDs of the same type individualized on the substrate in a matrix shape of rows and columns; and
a connection part connecting the micro LEDs to each other to form a micro LED group,
wherein adjacent micro LED groups are not connected to each other by the connection part, and
wherein the substrate is a temporary substrate or a growth substrate for collectively transferring the micro LED group to a sub-pixel region.

2. The micro LED group substrate of claim 1, wherein the connection part comprises a molding material removable by a laser or an etchant.

3. The micro LED group substrate of claim 1, wherein the connection part comprises a photoresist.

4. The micro LED group substrate of claim 1, wherein the connection part comprises an adhesive material.

5. The micro LED group substrate of claim 1, wherein the connection part comprises a metal.

6. The micro LED group substrate of claim 1, wherein the connection part comprises an adhesive film.

7. The micro LED group substrate of claim 1, wherein the connection part comprises epoxy, acrylic (polyacrylate), poly(methyl methacrylate) (PMMA), benzocyclobutene (BCB), polyimide, and polyester.

8. The micro LED group substrate of claim 1, wherein the micro LEDs of the same type emit a single color.

9. A micro LED display panel, comprising:
an array of unit pixel regions each of which is composed of a plurality of sub-pixel regions;
a micro LED group mounted on at least one of the sub-pixel regions and composed of a plurality of micro LEDs of the same type;
a common lower electrode provided on a lower portion of the micro LED group;
a common upper electrode provided on an upper portion of the micro LED group; and
a common joining layer provided singly on the common lower electrode to collectively join the micro LED group to the common lower electrode,
wherein the micro LEDs in the micro LED group are electrically connected in parallel to each other with respect to the common lower electrode and the common upper electrode,
wherein the micro LED group is composed of the micro LEDs arranged in a plurality of rows and a plurality of columns, and
wherein the micro LED group is collectively joined on the common joining layer.

10. The micro LED display panel of claim 9, wherein the micro LED group comprises a defective micro LED.

11. The micro LED display panel of claim 9, wherein the micro LED group comprises a missing micro LED.

12. The micro LED display panel of claim 9, wherein the number of micro LEDs in the micro LED group is different for each of the sub-pixel regions.

13. The micro LED display panel of claim 9, wherein the micro LEDs in the micro LED group are composed of micro LEDs of the same type.

14. The micro LED display panel of claim 9, wherein the common upper electrode is configured in a surface shape that entirely connects the micro LEDs in the micro LED group to each other.

15. The micro LED display panel of claim 9, wherein the common upper electrode is configured in a strip shape that entirely connects the micro LEDs in the micro LED group to each other.

16. The micro LED display panel of claim 9, wherein a pitch interval between the micro LEDs in the micro LED group is the same as a pitch interval between micro LEDs on a growth substrate for manufacturing the micro LEDs.

17. The micro LED display panel of claim 9, wherein a first micro LED group emitting a first color is mounted on a first sub-pixel region of the sub-pixel regions, a second micro LED group emitting light of a second color is mounted on a second sub-pixel region of the sub-pixel regions, and a third micro LED group emitting light of a third color is mounted on a third sub-pixel region of the sub-pixel regions.

18. The micro LED display panel of claim 9, wherein micro LEDs of the same type are mounted on each of the plurality of sub-pixel regions, and
a color conversion part is provided on the common upper electrode.

* * * * *